United States Patent
Terazono et al.

(10) Patent No.: US 7,911,063 B2
(45) Date of Patent: Mar. 22, 2011

(54) SEMICONDUCTOR DEVICE

(75) Inventors: Shinichi Terazono, Tokyo (JP);
Katsuhiko Akao, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/327,344

(22) Filed: Dec. 3, 2008

(65) Prior Publication Data

US 2009/0146313 A1    Jun. 11, 2009

(30) Foreign Application Priority Data

Dec. 5, 2007   (JP) ................. 2007-314914

(51) Int. Cl.
 *H01L 23/48* (2006.01)
(52) U.S. Cl. ........ 257/776; 257/774; 257/775; 257/786; 257/E23.143; 257/E23.145; 257/E23.151; 257/E23.152; 257/E23.153; 257/E23.168
(58) Field of Classification Search .......... 257/774, 257/773, E23.07, E23.151, E23.152, E23.175, 257/775, 776, 786, E23.143, E23.145, E23.153, 257/E23.168, E23.169
See application file for complete search history.

(56) References Cited

U.S. PATENT DOCUMENTS

| | | | | |
|---|---|---|---|---|
| 6,577,017 | B1 * | 6/2003 | Wong | 257/786 |
| 6,707,156 | B2 * | 3/2004 | Suzuki et al. | 257/758 |
| 6,958,542 | B2 | 10/2005 | Hasunuma et al. | |
| 7,049,701 | B2 * | 5/2006 | Usui | 257/773 |
| 7,180,192 | B2 | 2/2007 | Hasunuma et al. | |
| 7,301,240 | B2 | 11/2007 | Hasunuma et al. | |
| 7,335,992 | B2 | 2/2008 | Anzai | |
| 2005/0146041 | A1 | 7/2005 | Watanabe et al. | |
| 2007/0052068 | A1 | 3/2007 | Takemura et al. | |
| 2007/0120258 | A1 | 5/2007 | Hayashi et al. | |
| 2007/0182001 | A1 | 8/2007 | Kanzaki et al. | |

FOREIGN PATENT DOCUMENTS

| | | |
|---|---|---|
| JP | 2004-095916 | 3/2004 |
| JP | 2004-119969 | 4/2004 |
| JP | 2005-235809 | 9/2005 |
| JP | 2005-285971 | 10/2005 |
| JP | 2006-196487 | 7/2006 |
| JP | 2006-339406 | 12/2006 |
| JP | 2007-067332 | 3/2007 |
| WO | WO 2005/083767 A1 | 9/2005 |

* cited by examiner

*Primary Examiner* — Julio J Maldonado
(74) *Attorney, Agent, or Firm* — McDermott Will & Emery LLP

(57) ABSTRACT

In a semiconductor device according to an aspect of the invention, a direction in which a fourth metal interconnection layer located on a semiconductor layer is extended is orthogonal to a direction in which third interconnection layers ML30 and ML37 located on the fourth interconnection layer are extended. Thus, even in a case where a stress is applied from outside to bonding pads BP1 and BP2 located above, the stress is wholly dispersed by the third interconnection layers and the fourth interconnection layer which are laminated to intersect with each other, and stress concentration on a particular point can be relieved to restrain deterioration in semiconductor device strength to a minimum. Accordingly, it is possible to provide the semiconductor device having a structure in which productivity of the semiconductor device can be improved while the stress concentration applied from outside on the particular point of the bonding pad is relieved.

6 Claims, 23 Drawing Sheets

SEMICONDUCTOR DEVICE

BACKGROUND OF THE INVENTION

1. Field of the Invention

The present invention relates to a structure of a semiconductor device having a bonding pad, particularly to a structure of a semiconductor device for increasing strength against a stress applied to the bonding pad in probing and wire bonding.

2. Description of the Background Art

A mechanical stress is applied to a bonding pad formed on a top surface of a semiconductor chip during probing in an electric test of a semiconductor chip or during wire bonding in assembling a semiconductor device. The stress applied to the bonding pad possibly causes generation of a crack in an interlayer insulator below the bonding pad or generation of peel-off of the bonding pad during wire bonding.

A crack is generated in the interlayer insulator below the bonding pad by the stress applied from outside to the bonding pad. In a case where the crack reaches a lower-layer interconnection, deterioration occurs to a metal migration-resistant property of the interconnection. In a structure in which the interconnection is provided so as to pass below the bonding pad, strength thereof is relatively weak and a crack is easily generated. Therefore, disposition of an active element tends to be avoided. Accordingly, in order to prevent generation of a crack, desirably the interconnection and the active element do not carelessly pass below the bonding pad.

However, in order to achieve high integration of the semiconductor device, it is necessary that a semiconductor substrate be effectively utilized by using a region below the bonding pad. Therefore, it is inevitable that the interconnection and the active element are provided below the bonding pad. For example, WO2005/083767 discloses a structure of a semiconductor device in which strength against a stress applied from outside to a bonding pad is enhanced while achieving high integration of the semiconductor device.

The structure of the semiconductor device disclosed in WO2005/083767 adopts a configuration in which at least five interconnection layers are provided below the bonding pad in a case where an interconnection and an active element are provided below the bonding pad (see FIGS. 44 and 45 of WO2005/083767). The stress applied from outside to the bonding pad is dispersed by adopting the structure, and stress concentration on a particular point is relieved to restrain deterioration in semiconductor device strength to a minimum, thereby allowing the high integration of the semiconductor device.

However, because the deterioration in semiconductor device strength is restrained to a minimum, a production cost of the semiconductor device is increased in a case where at least five interconnection layers are provided. On the other hand, there is another method in which the stress applied to the bonding pad is strictly managed on a production apparatus side to decrease the number of interconnection layers during the probing in the electric test of the semiconductor chip or during the wire bonding in assembling the semiconductor device. However, in a case of adopting the method, productivity of the semiconductor device is largely sacrificed. Therefore, even in a case where this method is adopted, the production cost of the semiconductor device is increased.

Accordingly, the problem to be solved by the invention is that the production cost of the semiconductor device is increased when the stress concentration applied from outside on the particular point of the bonding pad of the semiconductor device is relieved to restrain the deterioration in semiconductor device strength to a minimum.

SUMMARY OF THE INVENTION

It is an object of the invention to provide a semiconductor device having a structure in which productivity of the semiconductor device can be improved while stress concentration applied from outside on a particular point of a bonding pad is relieved.

In a semiconductor device according to an aspect of the invention, there are laminated a first interconnection layer that includes a bonding pad exposed from an opening provided in a surface protective film, a first via layer that is provided below the first interconnection layer, a second interconnection layer that is provided below the first via layer, a second via layer that is provided below the second interconnection layer, a third interconnection layer that is provided below the second via layer and disposed in a stripe shape, a third via layer that is provided below the third interconnection layer, a fourth interconnection layer that is provided below the third via layer and disposed in a stripe shape, a fourth via layer that is provided below the fourth interconnection layer, and a semiconductor layer that is provided below the fourth via layer, and a direction in which the third interconnection layer is extended is orthogonal to a direction in which the fourth interconnection layer is extended.

Accordingly, in the semiconductor device of the above aspect, the direction in which the fourth metal interconnection layer located on the semiconductor layer is extended is orthogonal to the direction in which the third interconnection layer located on the fourth interconnection layer is extended. Therefore, even in a case where a stress is applied from outside to the bonding pad located thereabove, the stress is wholly dispersed by the third interconnection layer and fourth interconnection layer which are laminated to intersect with each other, and stress concentration on the particular point can be relieved to restrain deterioration in semiconductor device strength to a minimum.

As a result, even in the semiconductor device including the interconnection layers of such a four-layer structure, an active element can be disposed below the interconnection layers of the four-layer structure, so that the high integration of the semiconductor device can be achieved. Because an additional step is not required in a production process, a production cost of the semiconductor device is not increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
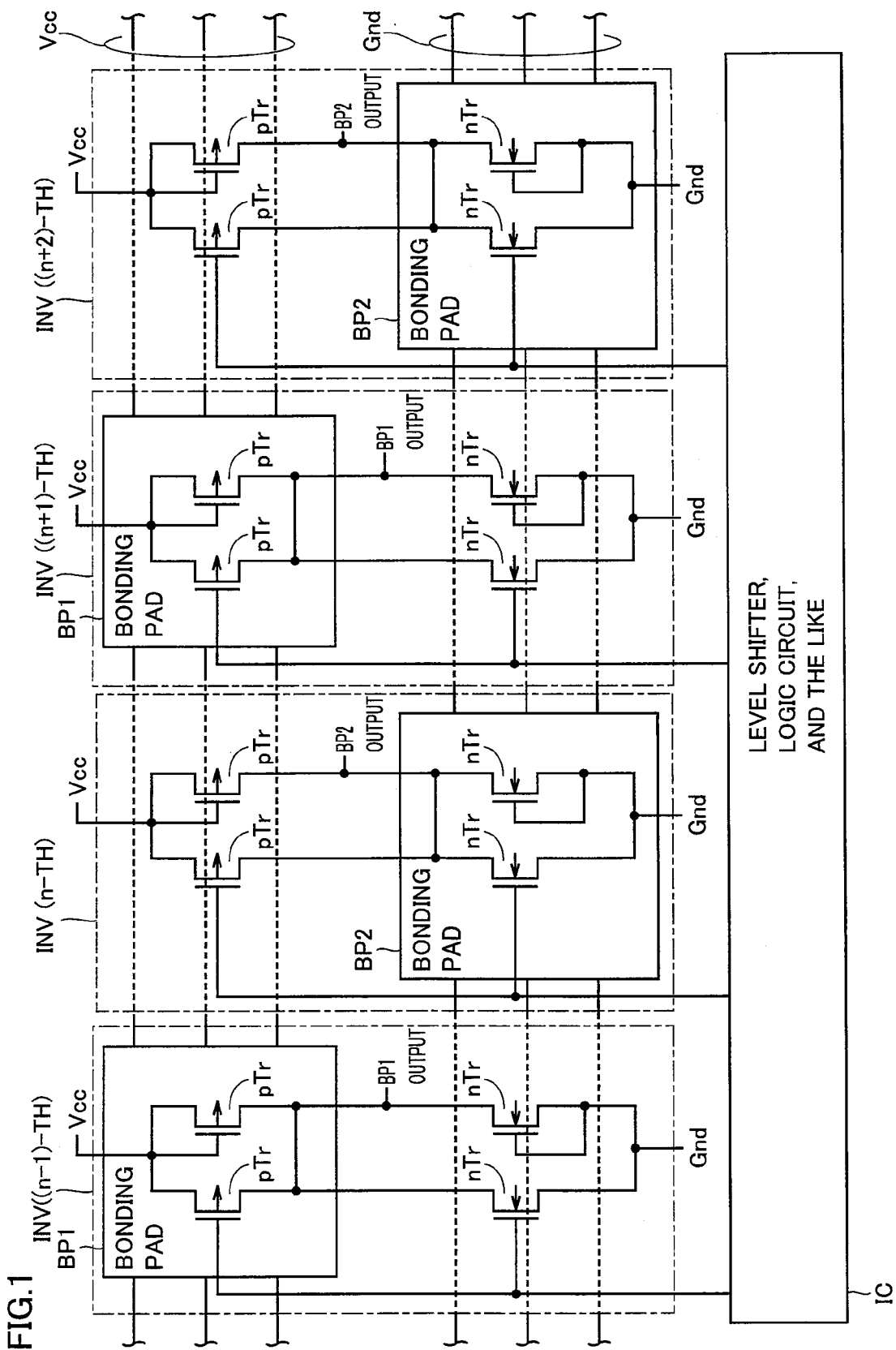
FIG. 1 is a circuit diagram showing an input and output unit of a semiconductor device according to a first embodiment of the present invention.

Referring to the drawings, structures of semiconductor devices according to respective embodiments of the present invention will be described below.

First Embodiment

Referring to FIG. 1 to 14, a structure of a semiconductor device according to a first embodiment of the invention will be described. In the semiconductor device of the first embodiment, a region below a bonding pad is effectively utilized in order to achieve the high integration, and a specific layout of a structure below the bonding pad will be described.

A power supply interconnection and a buffer interconnection are disposed in an outer peripheral region of the bonding pad. FIG. 1 is a circuit diagram showing an input and output unit in the semiconductor device of the first embodiment. A Vcc (power supply potential) interconnection is provided outside a Grid (reference potential) interconnection along an outer edge of a semiconductor chip CP (see FIG. 14), and the Gnd interconnection is provided inside the Vcc interconnection along the outer edge of the semiconductor chip CP. The Vcc (power supply potential) interconnection and Grid (reference potential) interconnection are shown by broken lines in FIG. 1 for the purpose of easy understanding of a structure of a transistor formed in a layer below the interconnections.

Plural bonding pads BP1 are disposed at predetermined intervals along an interconnection direction above a direction in which the Vcc (power supply potential) interconnections are laminated, and plural bonding pads BP2 are disposed at predetermined intervals along the interconnection direction above a direction in which the Gnd (reference potential) interconnections are laminated.

A circuit that is formed by a PMOS transistor pTr in a semiconductor layer below the Vcc (power supply potential) interconnection and a circuit that is formed by a NMOS transistor nTr in a semiconductor layer below the Gnd (reference potential) interconnection are connected between bonding pad BP1 and bonding pad BP2 and an internal circuit IC.

In the first embodiment, bonding pads BP1 and bonding pads BP2 are arranged in a zigzag manner in a planar view along the direction in which the Vcc (power supply potential) interconnection and the Gnd (reference potential) interconnection are extended, thereby allowing the semiconductor device to be further integrated. This point is described in detail later.

An output inverter INV surrounded by an alternate long and dash line of FIG. 1 includes two PMOS transistors pTr and two NMOS transistors nTr. Bonding pad BP2 is disposed on two NMOS transistor nTr of an n-th output inverter INV, bonding pad BP1 is disposed on two PMOS transistor pTr of an (n+1)-th output inverter INV, bonding pad BP2 is disposed on two NMOS transistor nTr of an (n+2)-th output inverter INV, and the configurations are repeated to an (n+k)-th output inverter (n and k are integers).

Bonding pads BP1 located on two PMOS transistors pTr and bonding pads BP2 located on two NMOS transistors nTr are repeatedly arranged in output inverters INV. Therefore, plural output inverters INV can easily be arranged in a small area, and the layout also becomes simplified.

Figure 9:
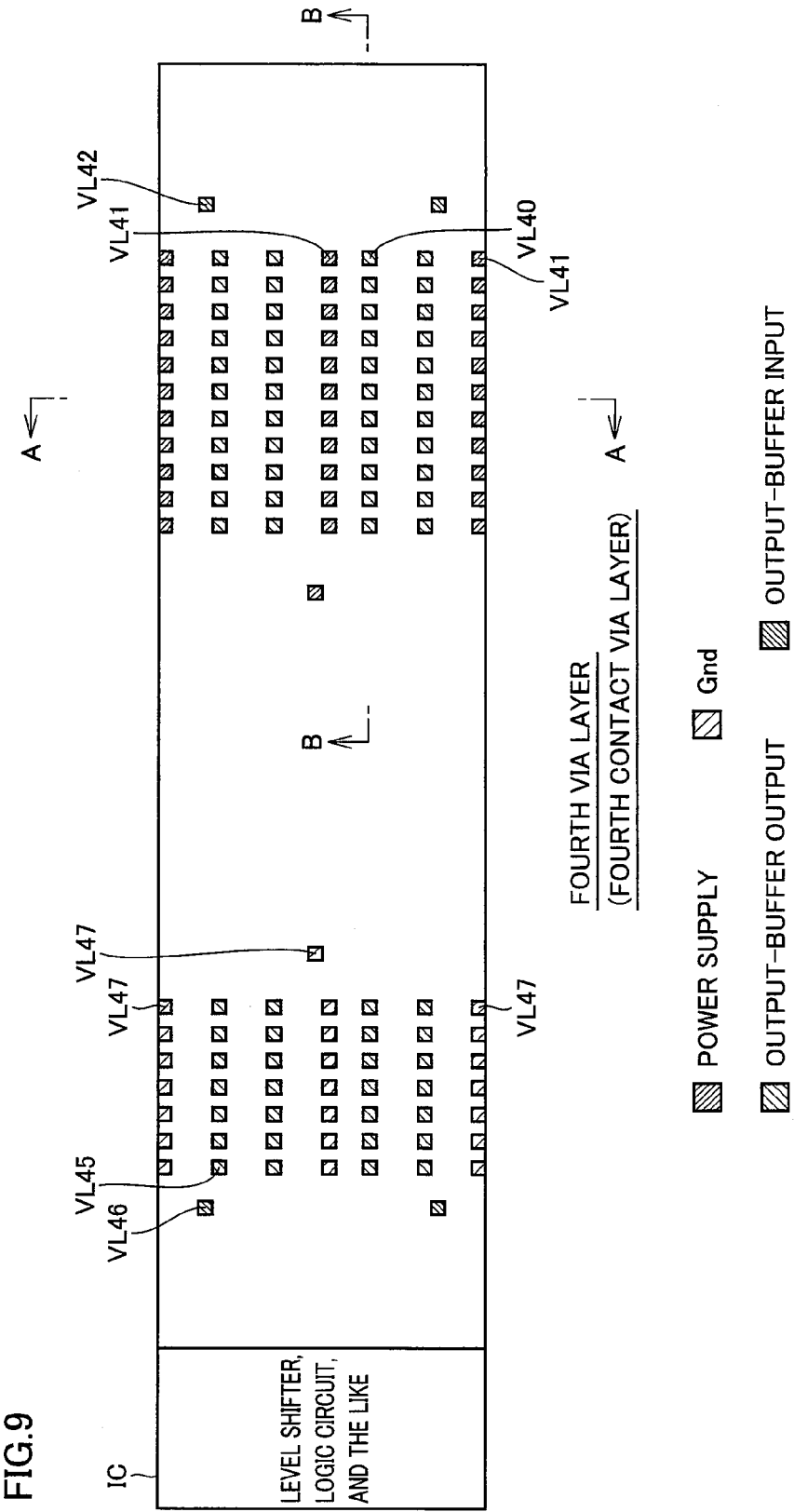
FIG. 9 is a layout chart showing a fourth via layer of the input and output unit in the semiconductor device according to the first embodiment of the present invention.
Figure 10:
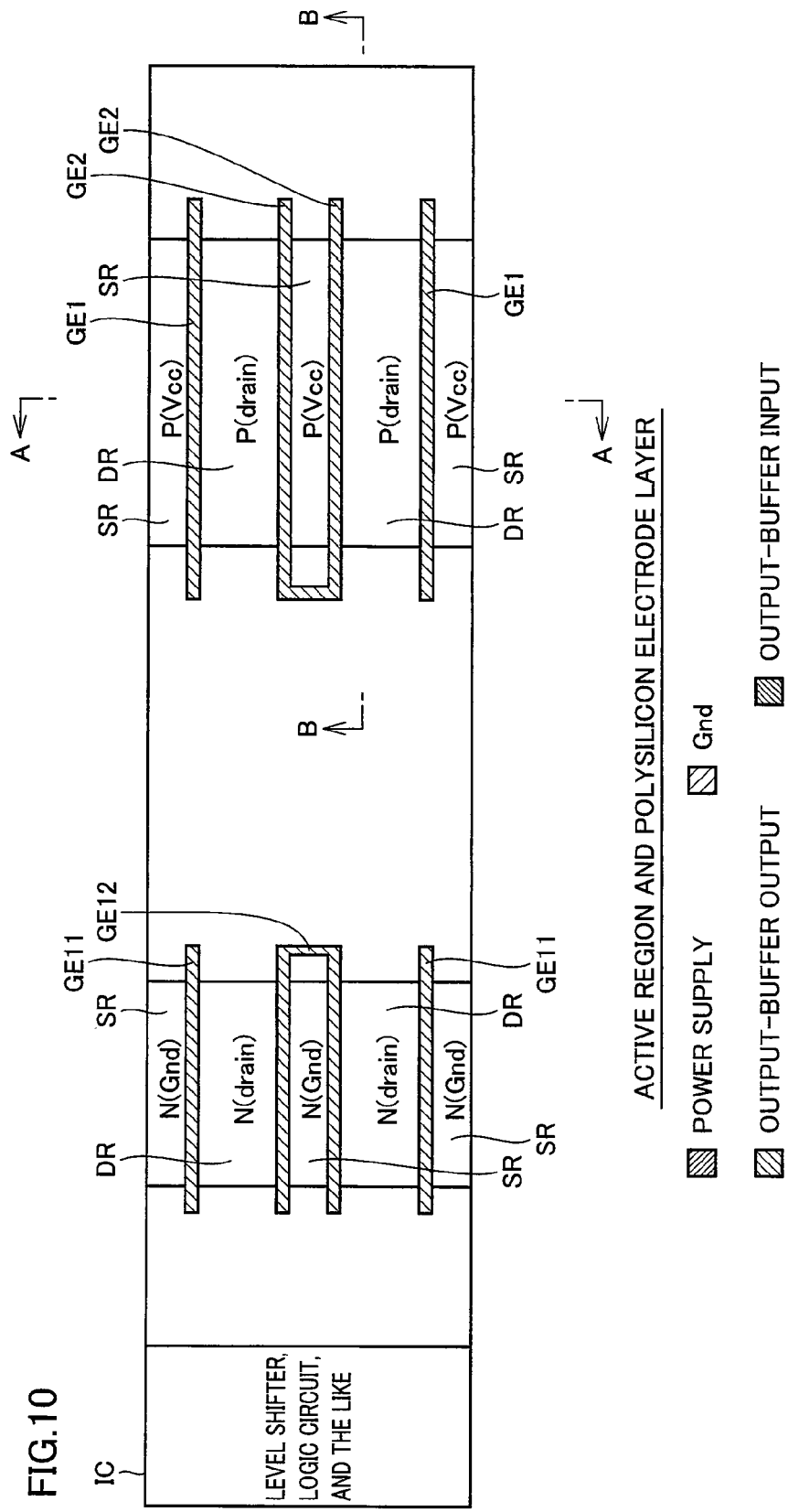
FIG. 10 is a layout chart showing an active region and a polysilicon electrode layer of the input and output unit in the semiconductor device according to the first embodiment of the present invention.
Figure 11:
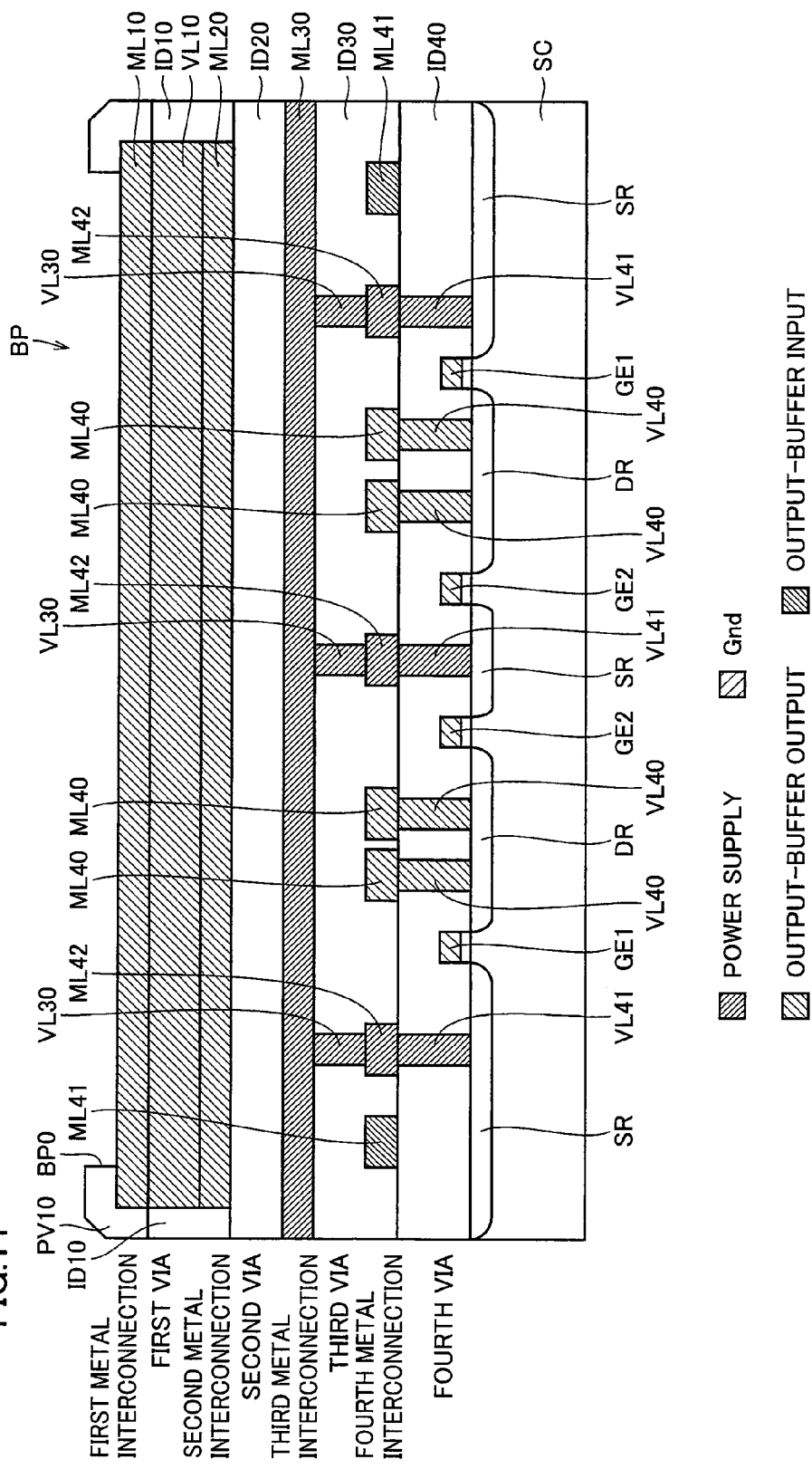
FIG. 11 is a sectional view (taken on a line A-A and seen along an arrow) showing the input and output unit in the semiconductor device according to the first embodiment of the present invention.
Figure 12:
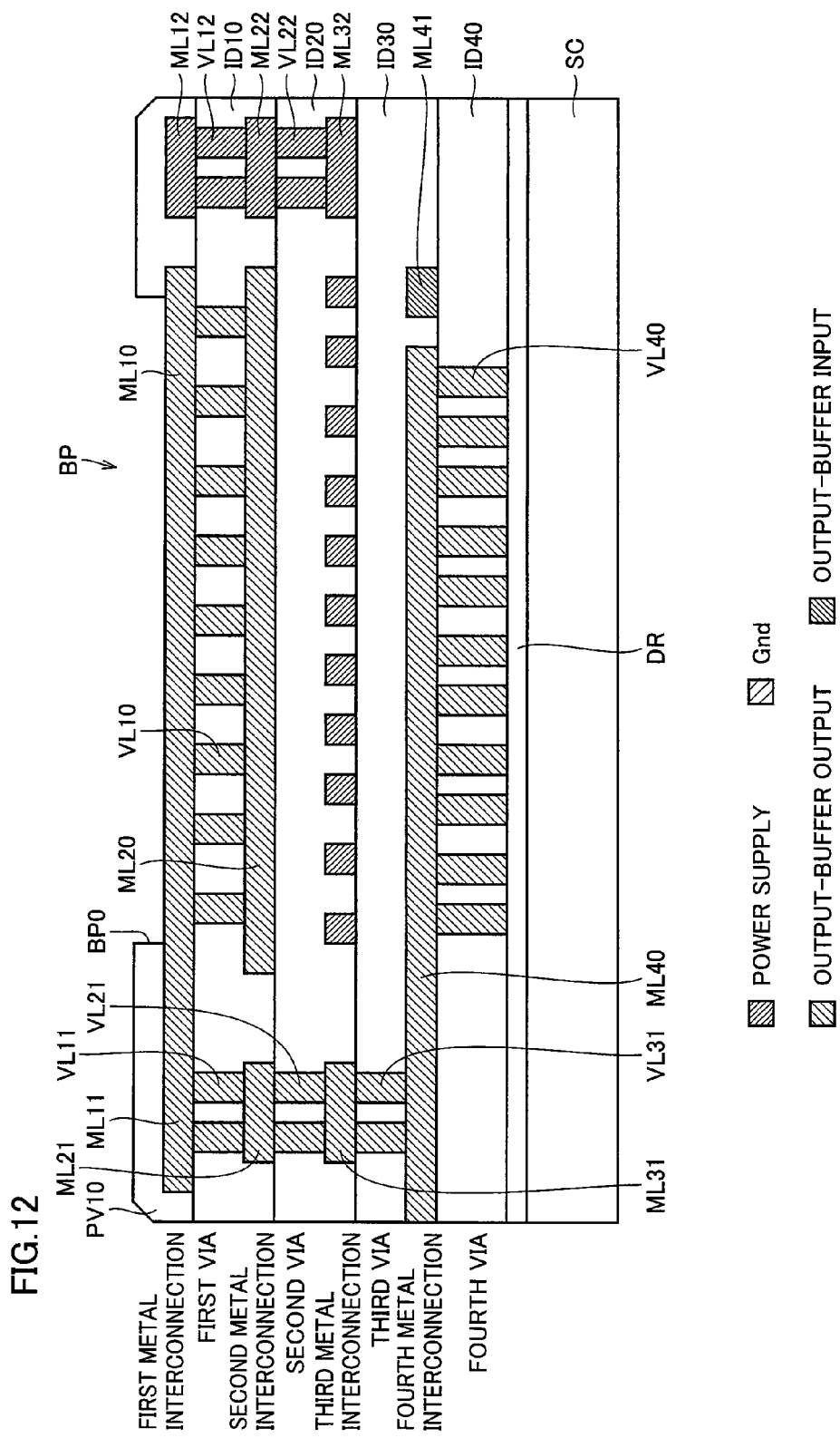
FIG. 12 is a sectional view (taken on a line B-B and seen along an arrow) showing the input and output unit in the semiconductor device according to the first embodiment of the present invention.

FIGS. 2 to 12 are views showing a configuration of the input and output unit in the semiconductor device of the first embodiment. FIGS. 2 to 10 are layout charts showing an interconnection layer and a via layer of the input and output unit, and FIGS. 11 and 12 are sectional views showing the input and output unit. Referring to FIG. 2 to 12, the structure of the semiconductor device of the first embodiment will be described.

A correspondence between the layout charts of FIGS. 2 to 10 and the sectional views of FIGS. 11 and 12 will be described. FIG. 11 is a sectional view taken on a line A-A and seen along an arrow that is shown in the layout charts of FIGS. 2 to 10, and FIG. 12 is a sectional view taken on a line B-B and seen along an arrow that is shown in the layout charts of FIGS. 2 to 10.

Figure 2:
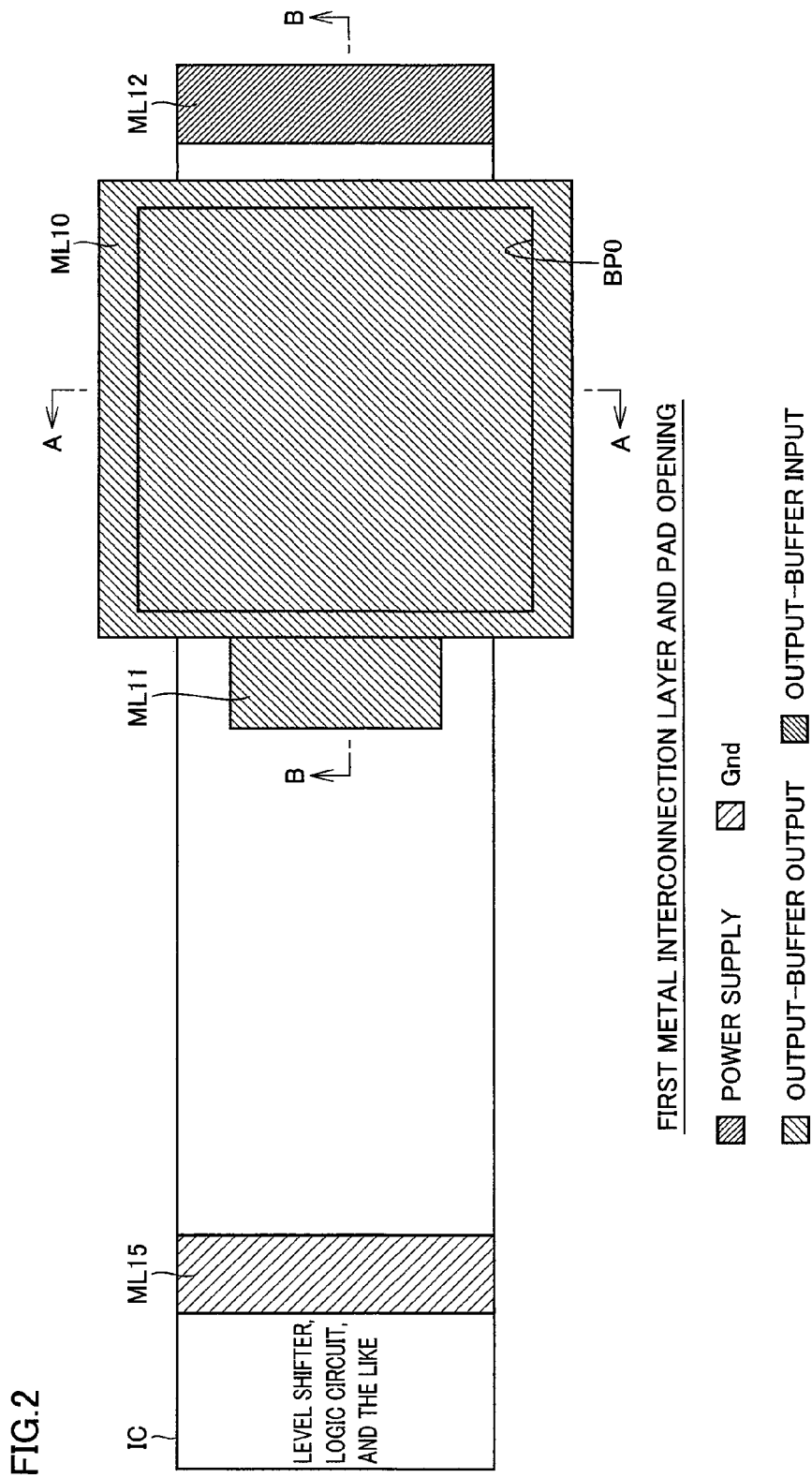
FIG. 2 is a layout chart showing a first metal interconnection layer and a bonding pad opening of the input and output unit in the semiconductor device according to the first embodiment of the present invention.
Figure 3:
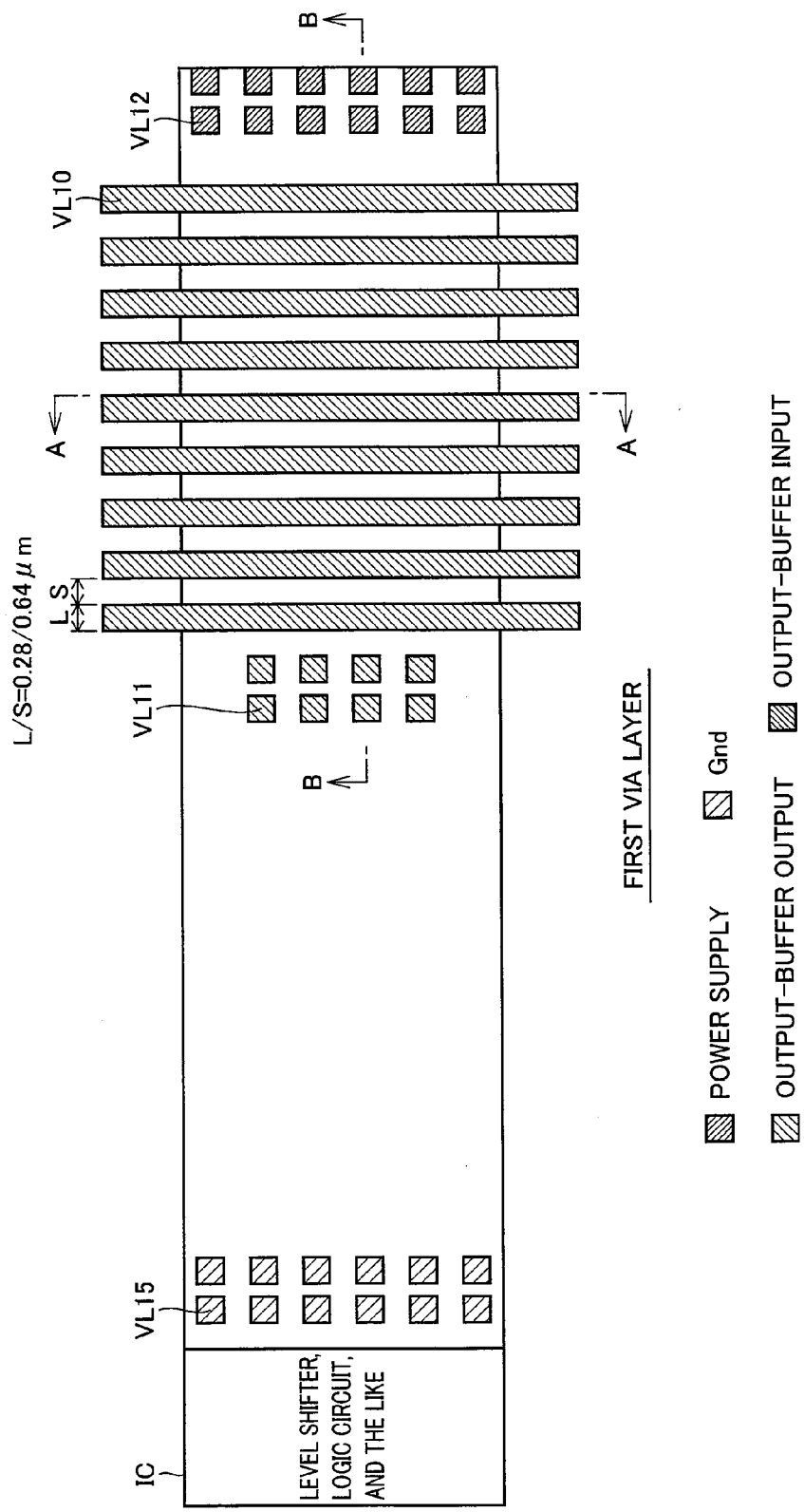
FIG. 3 is a layout chart showing a first via layer of the input and output unit in the semiconductor device according to the first embodiment of the present invention.
Figure 4:
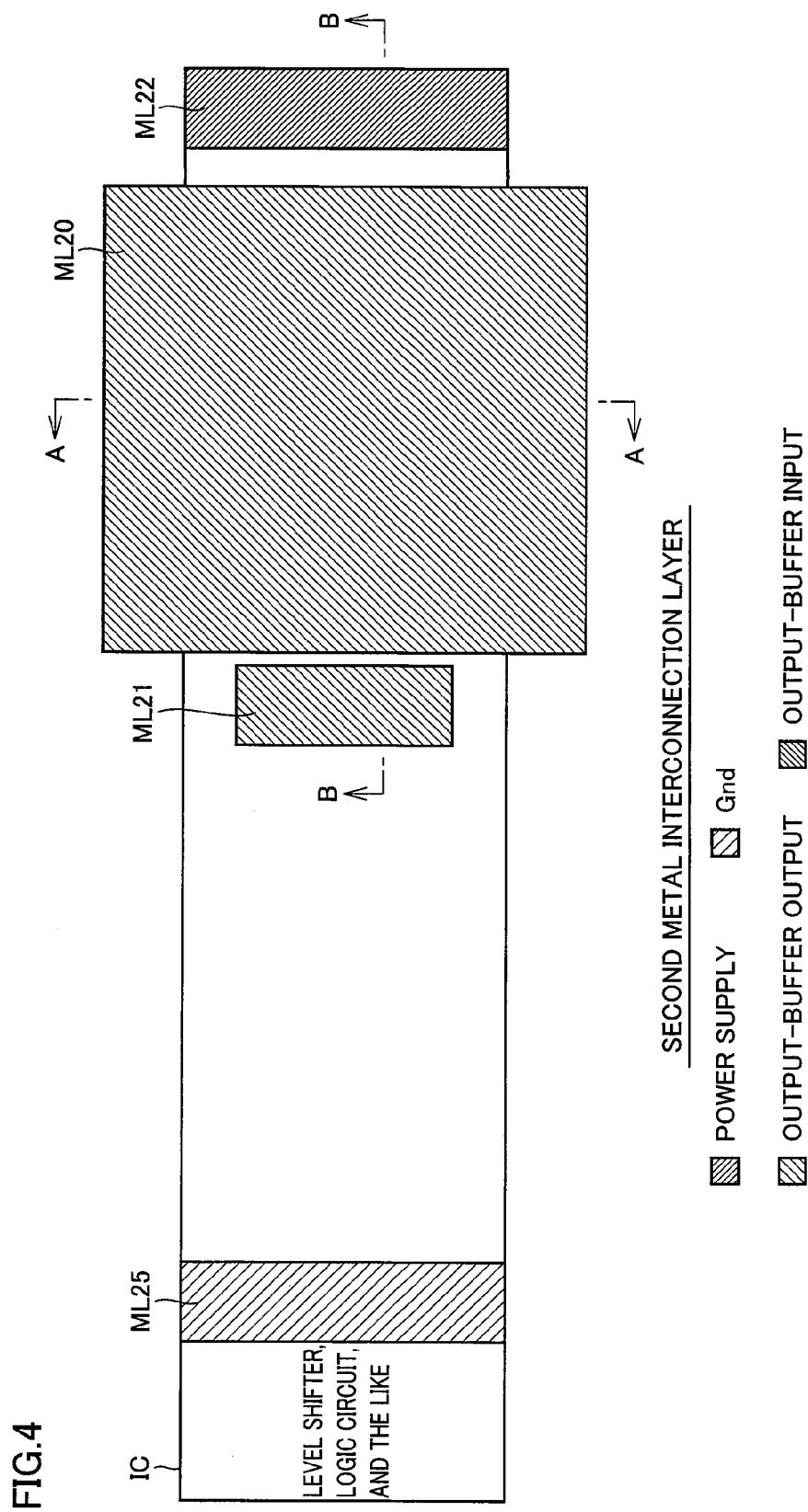
FIG. 4 is a layout chart showing a second metal interconnection layer of the input and output unit in the semiconductor device according to the first embodiment of the present invention.

FIG. 2 shows a layout of first metal interconnection layers ML10, ML11, ML12, and ML15 on an interlayer insulator ID10 and an opening BPO of a passivation film PV10 with which interlayer insulator ID10 is covered. FIG. 3 shows a layout of first via layers VL10, VL11, VL12, and VL15 in interlayer insulator ID10 with which a second metal interconnection layer is covered. FIG. 4 shows a layout of second metal interconnection layers ML20, ML21, ML22, and ML25 on an interlayer insulator ID20.

Figure 5:
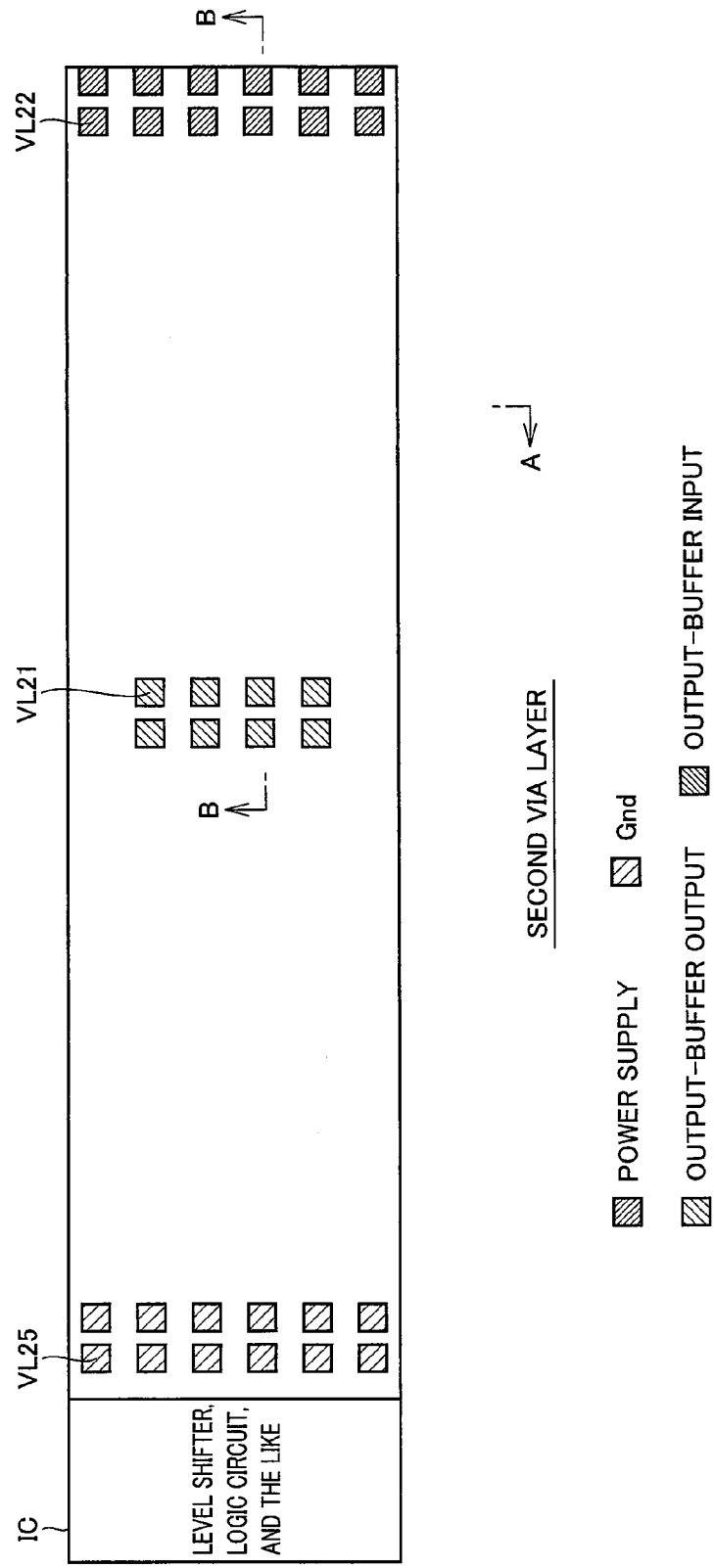
FIG. 5 is a layout chart showing a second via layer of the input and output unit in the semiconductor device according to the first embodiment of the present invention.
Figure 6:
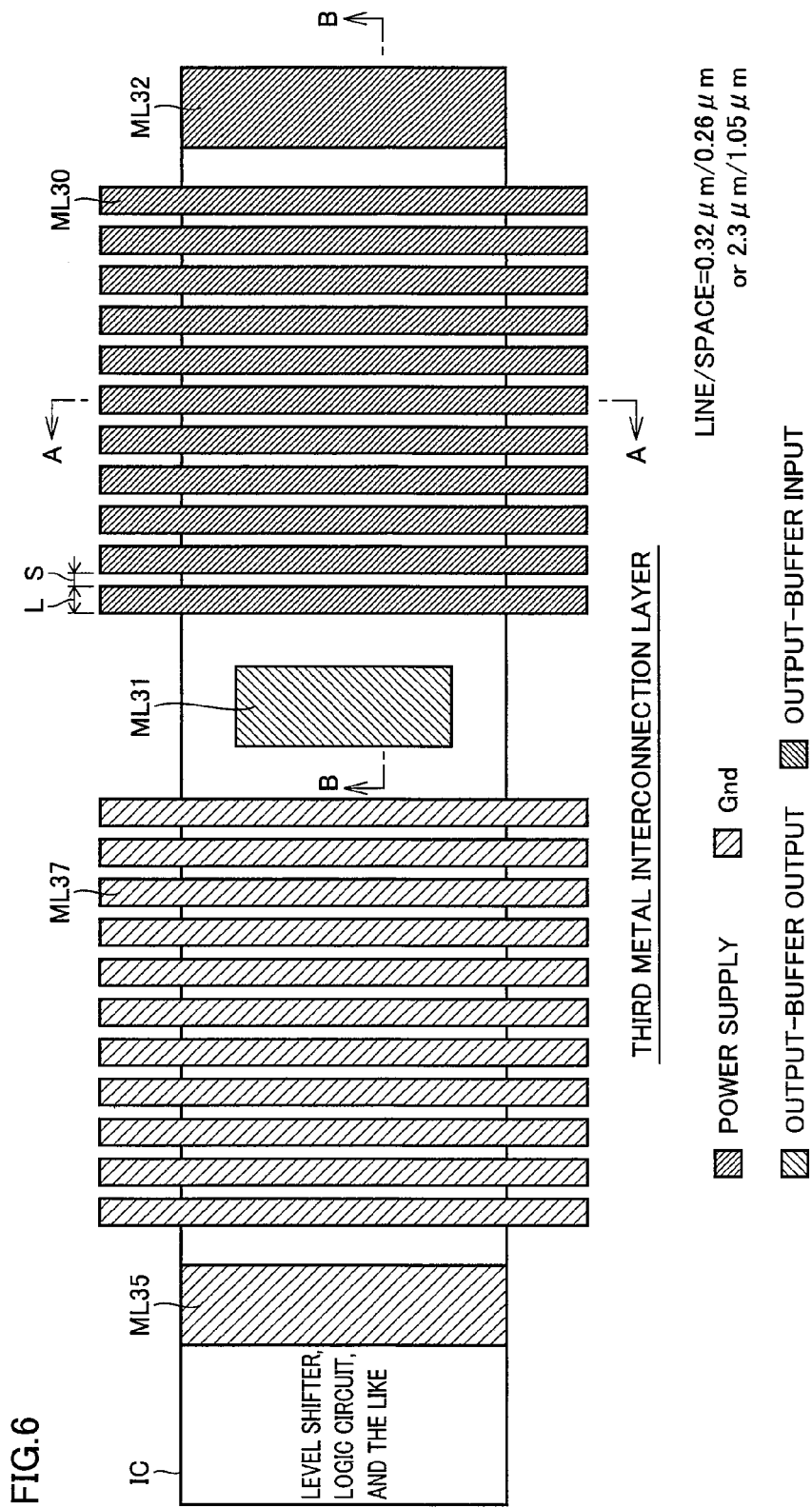
FIG. 6 is a layout chart showing a third metal interconnection layer of the input and output unit in the semiconductor device according to the first embodiment of the present invention.
Figure 7:
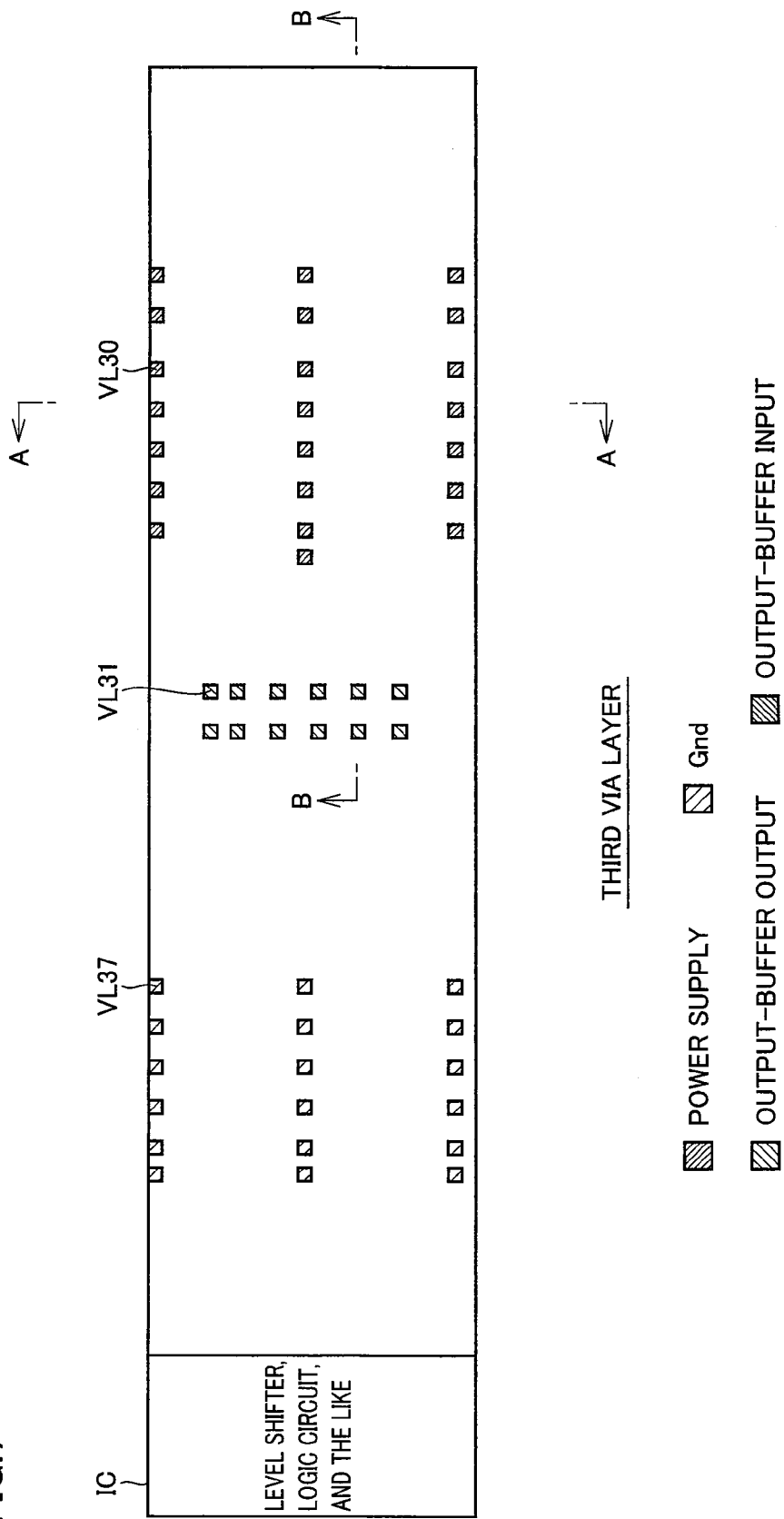
FIG. 7 is a layout chart showing a third via layer of the input and output unit in the semiconductor device according to the first embodiment of the present invention.
Figure 8:
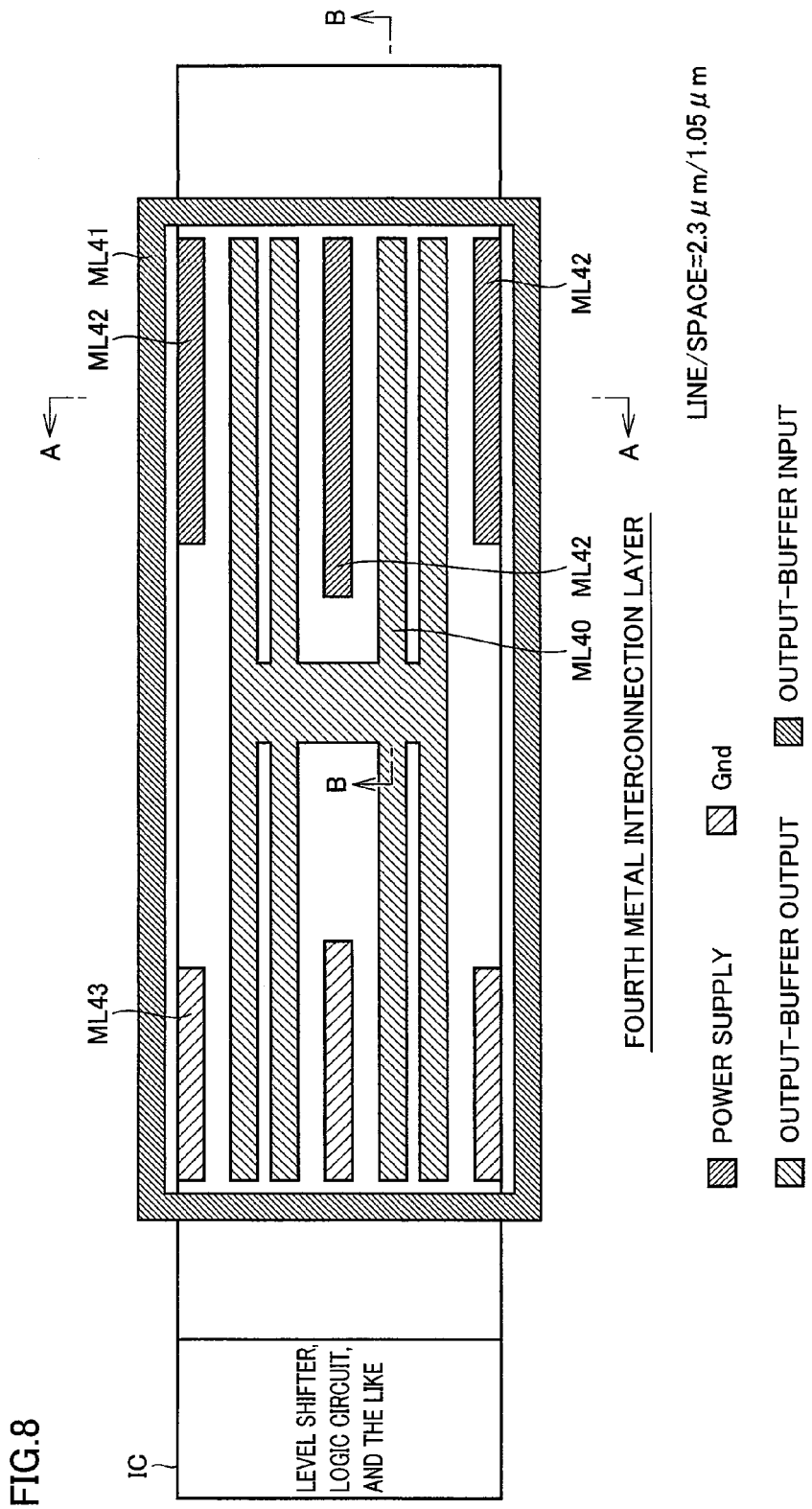
FIG. 8 is a layout chart showing a fourth metal interconnection layer of the input and output unit in the semiconductor device according to the first embodiment of the present invention.

FIG. 5 shows a layout of second via layers VL21, VL22, and VL25 in interlayer insulator ID20 with which a third metal interconnection layer is covered. FIG. 6 shows a layout of third metal interconnection layers ML30, ML31, ML32, ML35, and ML37 on an interlayer insulator ID30. FIG. 7 shows a layout of third via layers VL30, VL31, and VL37 in interlayer insulator ID30 with which a fourth metal interconnection layer is covered. FIG. 8 shows a layout of fourth metal interconnection layers ML40, ML41, ML42, and ML43 on an interlayer insulator ID40.

FIG. 9 shows a layout of fourth via layers VL40, VL41, VL42, VL45, VL46, and VL47 in interlayer insulator ID40 with which a semiconductor layer SC shown in FIGS. 11 and 12 is covered. FIG. 10 shows a layout of active regions SR and DR provided in semiconductor layer SC and polysilicon electrode layers GE1 and GE2 provided on semiconductor layer SC.

In FIGS. 2 to 10, although the left portion of the layout chart is a region where internal circuit IC is formed, the specific layout chart of the region is not shown for the sake of convenience. In the sectional views of FIGS. 11 and 12, the section on the Vcc (power supply potential) interconnection side is shown while the section on the Gnd (reference potential) interconnection side is neglected.

A general interconnection material can be used as a material for each metal interconnection layer. Aluminum, copper, and alloys thereof (such as Al—Si—Cu and Al—Cu) can be cited as an example of the material for each metal interconnection layer. A general via material can be used as a material for each via layer. Tungsten, copper, and alloys thereof can be cited as an example of the material for each via layer.

For the sake of convenience, the metal interconnection and the via of FIGS. 2 to 12 are shown by hatching which classified into functions thereof. Specifically, the metal interconnection and the via are classified into a power supply node, a ground (reference potential) node, an output node of an output buffer, and an input node of the output buffer. In FIGS. 2 to 12, the same component is designated by the same numeral.

As shown in FIG. 2, first metal interconnection layers ML10 and M11 are set at the output node of the output buffer, first metal interconnection layer ML12 is set at the power supply node, and first metal interconnection layer ML15 is set at the ground node. As shown in FIG. 3, first via layer VL10 is set at the output node of the output buffer, first via layer VL11 is set at the output node of the output buffer, first via layer VL12 is set at the power supply node, and first via layer VL15 is set at the ground node.

Because plural first via layers VL10 are arranged in line, first via layers VL10 have a stripe shape. First via layer VL10 is provided in a direction in which first via layer VL10 is extended in parallel with the outer peripheral edge of semiconductor chip CP (see FIGS. 13 and 14). First via layer VL10 has a line width (L) of about 0.28 μm, and an interval (S) between first via layers VL10 becomes about 0.64 μm.

As shown in FIG. 4, second metal interconnection layers ML20 and M21 are set at the output node of the output buffer, second metal interconnection layer ML22 is set at power supply node, and second metal interconnection layer ML25 is set at the ground node. As shown in FIG. 5, second via layer VL21 is set at the output node of the output buffer, second via layer VL22 is set at the power supply node, and second via layer VL25 is set at the ground node.

As shown in FIG. 6, third metal interconnection layer ML30 is set at the power supply node, third metal interconnection layer ML31 is set at the output node of the output buffer, third metal interconnection layer ML32 is set at the power supply node, and third metal interconnection layers ML35 and ML37 are set at the ground node. Because plural third metal interconnection layers ML30 are arranged in a line, third metal interconnection layers ML30 have a stripe shape. Third metal interconnection layer ML30 is provided in a direction in which third metal interconnection layer ML30 is extended in parallel with the outer peripheral edge of semiconductor chip CP.

In a case where third metal interconnection layer ML30 has the line width (L) of about 0.32 μm, the interval (S) between third metal interconnection layers ML30 becomes about 0.26 μm. In a case where third metal interconnection layer ML30 has the line width (L) of about 2.3 μm, the interval (S) between third metal interconnection layers ML30 becomes about 1.05 μm. The same holds true for the line (L)/space (S) of third metal interconnection layer ML37.

As shown in FIG. 7, third via layer VL30 is set at the power supply node, third via layer VL31 is set at the output node of the output buffer, and third via layer VL37 is set at the ground node. As shown in FIG. 8, fourth metal interconnection layer ML40 is set at the output node of the output buffer, fourth metal interconnection layer ML41 is set at the input node of the output buffer, fourth metal interconnection layer ML42 is set at the power supply node, and fourth metal interconnection layer ML43 is set at the ground node. Because fourth metal interconnection layers ML40, ML41, ML42, and ML43 are arranged in a line, fourth metal interconnection layers ML40, 41, 42, and 43 have the stripe shape.

Because fourth metal interconnection layers ML40, ML41, ML42, and ML43 are provided along a direction intersecting the outer peripheral edge of semiconductor chip CP, the direction in which third metal interconnection layer ML30 is extended is orthogonal to the direction in which fourth metal interconnection layers ML40, ML41, ML42, and ML43 are extended. Only fourth metal interconnection layer ML41 is provided into a circular shape so as to surround fourth metal interconnection layers ML41, ML42, and ML43. Fourth metal interconnection layers ML40, ML41, ML42, and ML43 have the line width (L) of about 2.3 μm, and the interval (S) becomes about 1.05 μm for each of fourth metal interconnection layers ML40, ML41, ML42, and ML43.

Fourth metal interconnection layer ML40 (output node of the output buffer) is divided into two across center fourth metal interconnection layer ML42 (power supply node). This is because the crack generation is increased in a case where fourth metal interconnection layer ML40 is formed only by one interconnection. That is, fourth metal interconnection layer ML40 is divided into two from the standpoint of preventing the crack generation. Accordingly, when needed, fourth metal interconnection layer ML40 can be divided into at least three to effectively prevent the crack generation.

As shown in FIG. 9, fourth via layer VL40 is set at the output node of the output buffer, fourth via layer VL41 is set at the power supply node, fourth via layer VL42 is set at the input node of the output buffer, fourth via layer VL45 is set at the output node of the output buffer, fourth via layer VL46 is set at the input node of the output buffer, and fourth via layer VL47 is set at the ground node.

As shown in FIG. 10, in the region where the PMOS transistor is formed, a P-type active region DR (drain) and a P-type active region SR (source: Vcc) are formed in semiconductor layer SC. Gate electrode layers GE1 and GE2 made of polysilicon are provided in a direction intersecting the outer peripheral edge of semiconductor chip CP. Therefore, the direction in which gate electrode layers GE1 and GE2 are extended is parallel to the direction in which fourth metal interconnection layers ML40, ML41, ML42, and ML43 are extended.

In the region where the NMOS transistor is formed, an N-type active region DR (drain) and an N-type active region SR (source: Vcc) are formed in semiconductor layer SC. Gate electrode layers GE11 and GE12 made of polysilicon are provided in the direction intersecting the outer peripheral edge of semiconductor chip CP. Therefore, the direction in which gate electrode layers GE11 and GE12 are extended is parallel to the direction in which fourth metal interconnection layers ML40, ML41, ML42, and ML43 are extended.

Figure 13:
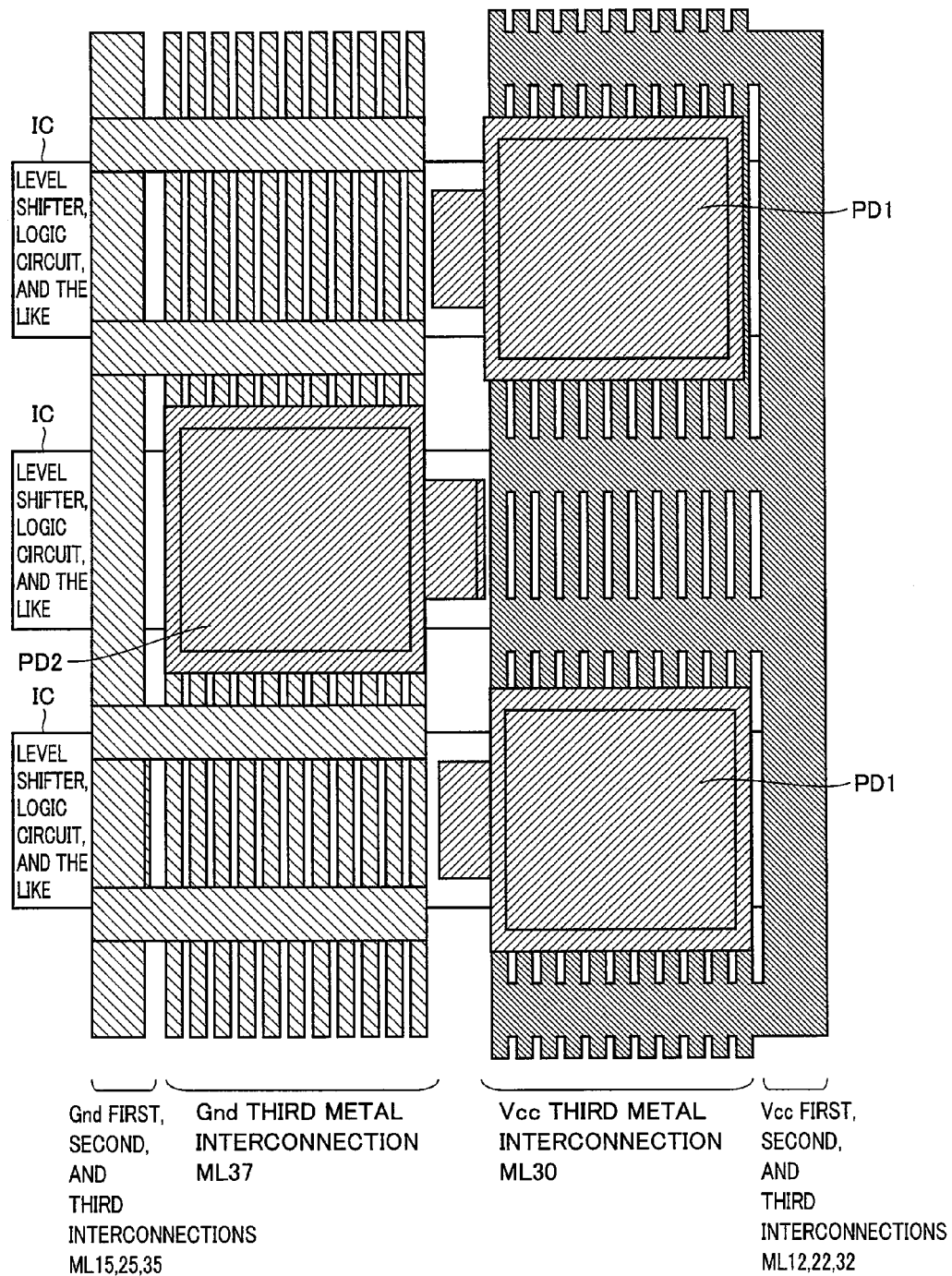
FIG. 13 is a layout chart showing an interconnection of the input and output unit in the semiconductor device according to the first embodiment of the present invention.

FIG. 13 is a view showing an interconnection layout of a four-layer interconnection structure in the outer peripheral edge of semiconductor chip CP of the semiconductor device having the above-described configuration. Referring to FIG. 13, first, second, and third metal interconnections ML12, ML22, and ML32 having Vcc (power supply potential) are disposed in the outermost region, third metal interconnection ML30 having Vcc (power supply potential) is disposed in the region inside first, second, and third metal interconnections ML12, ML22, and ML32, third metal interconnection ML37 having Gnd (reference potential) is disposed in the region inside third metal interconnection ML30, and Gnd (reference potential) of first, second, and third metal interconnections ML15, ML25, and ML35 having Gnd (reference potential) are disposed inside third metal interconnection ML37.

In the semiconductor device of the first embodiment, the direction in which fourth metal interconnection layers ML40, ML41, ML42, and ML43 located on semiconductor layer SC are extended is orthogonal to the direction in which third interconnection layers ML30 and ML37 located on fourth metal interconnection layers ML40, ML41, ML42, and ML43 are extended.

Therefore, even in a case where the stress is applied from outside to bonding pads BP1 and BP2 located above, the stress transferred to the lower portion is wholly dispersed by third interconnection layers ML30 and ML37 and fourth interconnection layers ML40, ML41, ML42, and ML43 which are laminated to intersect with each other, so that the stress concentration on a particular point can be relieved to restrain the deterioration in semiconductor device strength to a minimum.

Accordingly, in the semiconductor device of the four-layer structure in which the first to fourth interconnection layers are formed, the active elements such as the PMOS transistor forming region and the NMOS transistor forming region are disposed below the four-layer-structure interconnection layer, so that the high integration of the semiconductor device can be achieved. Because an additional step is not required in the production process, the production cost of the semiconductor device is not increased.

In the first embodiment, a lower-layer metal interconnection width (L) is larger than an upper-layer metal interconnection width (L). A deflection amount caused by the stress applied from the bonding pad is largely set on the upper-layer side by narrowing the upper-layer-side metal interconnection width, thereby allowing the stress to be absorbed at an early stage on the upper-layer side way from the active elements.

Figure 14:
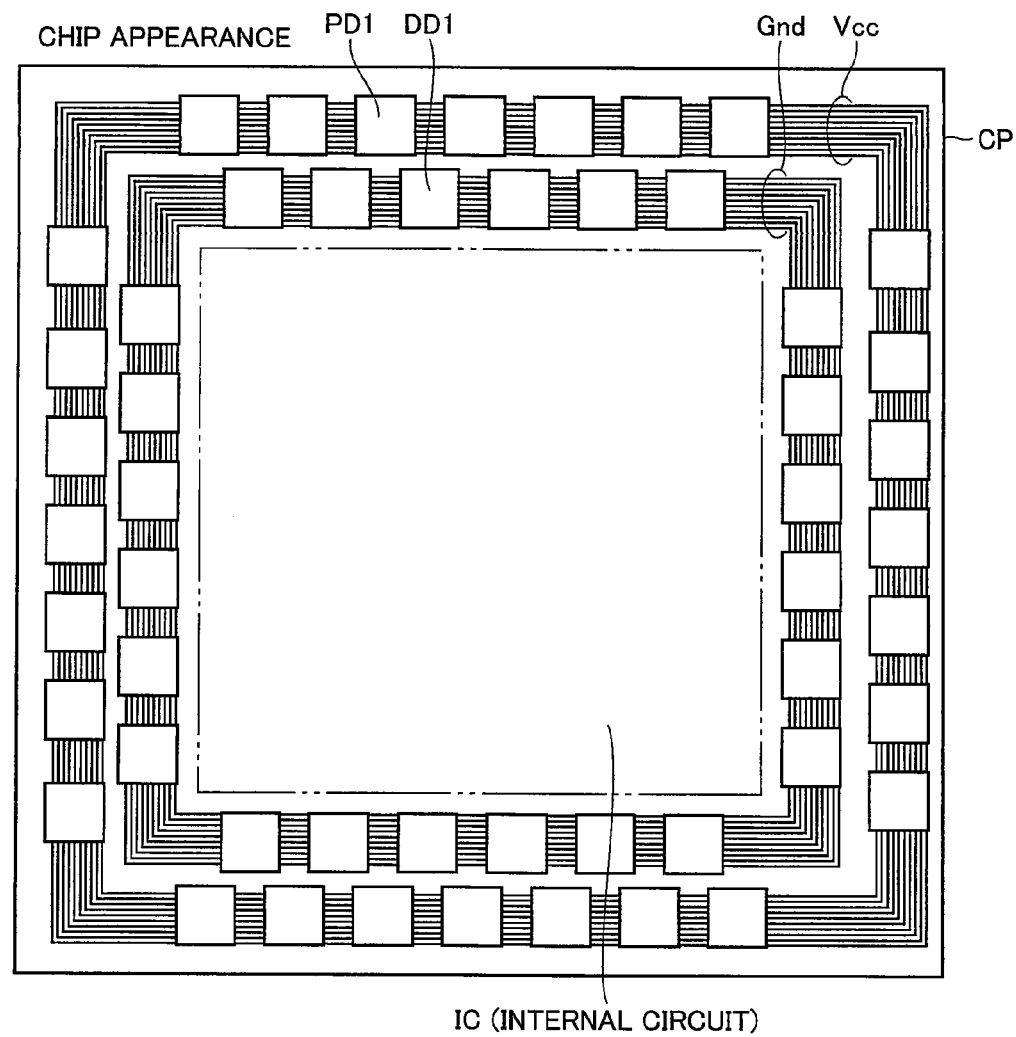
FIG. 14 is a layout chart showing an interconnection of a semiconductor chip according to the first embodiment of the present invention.

In the first embodiment, as shown in FIGS. 13 and 14, circular power supply potential interconnection Vcc disposed along the direction in which the outer peripheral edge of semiconductor chip CP is extended and circular reference potential interconnection Gnd disposed inside power supply potential interconnection Vcc are provided to define the circuit in which third metal interconnection layer ML30 is used as power supply potential interconnection Vcc and the circuit in which third metal interconnection layer ML37 is used as reference potential interconnection Gnd.

Therefore, an arrangement pitch of bonding pads BP1 arranged above the direction in which power supply potential interconnections Vcc are laminated can be determined based on a size of bonding pad BP1. An arrangement pitch of bonding pads BP2 arranged above the direction in which reference potential interconnection Gnd are laminated can also be determined based on a size of bonding pad BP2.

As shown in FIG. 14, bonding pads BP1 and BP2 can be arranged in the zigzag manner in the planar view along the direction in which the Vcc (power supply potential) interconnection and the Gnd (reference potential) interconnection are extended. Therefore, the semiconductor device can further be integrated.

The fourth metal interconnection layer is orthogonal to the third metal interconnection layer. Therefore, the circuit used as power supply potential interconnection Vcc and the circuit used as the reference potential interconnection Gnd can be directly connected in the region below the bonding pad without drawing power supply potential interconnection Vcc and reference potential interconnection Gnd to a surrounding area of the bonding pad. The high integration of the semiconductor device can also be achieved from this point of view.

The semiconductor device of the four-layer structure in which all the interconnection layers act as real interconnection is described in the first embodiment. However, in at least five interconnection layers in which a dummy interconnection is provided between the real interconnections, the metal interconnection layer (fourth metal interconnection layer of the first embodiment) immediately above the semiconductor layer in which the active element is formed and the metal interconnection layer (third metal interconnection layer of the third embodiment) located above the metal interconnection layer (fourth metal interconnection layer of the first embodiment) are provided so as to be orthogonal to each other. Therefore, even in a case where the stress is applied from outside to the bonding pad located above, the stress transferred to the lower portion is wholly dispersed by the upper-side interconnection layers and the lower-side interconnection layers which are laminated to intersect with each other, so that the stress concentration on a particular point can be relieved to restrain the deterioration in semiconductor device strength to a minimum.

Second Embodiment

Figure 15:
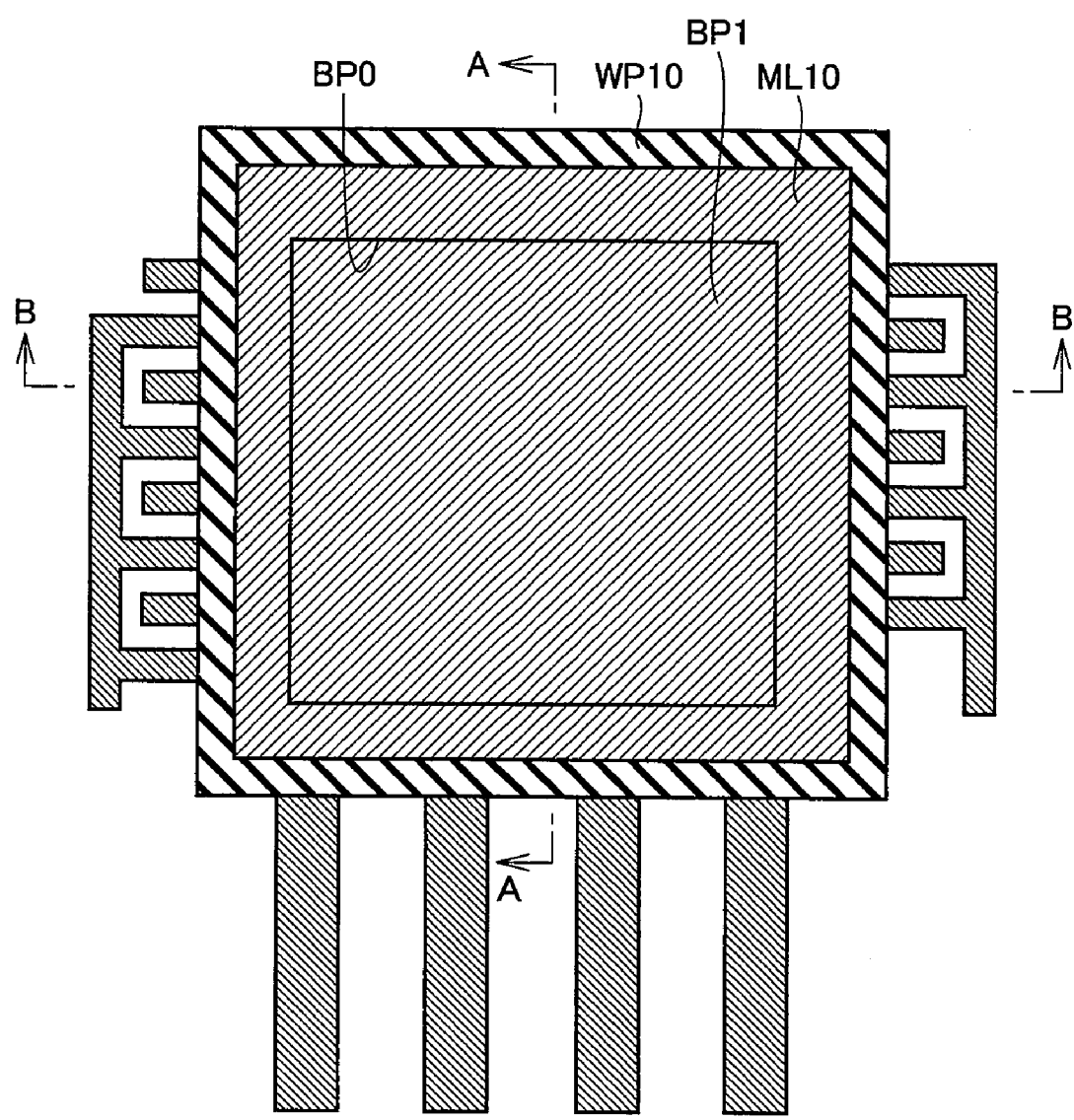
FIG. 15 is a layout chart showing an interconnection of an input and output unit in a semiconductor device according to a second embodiment of the present invention.
Figure 16:
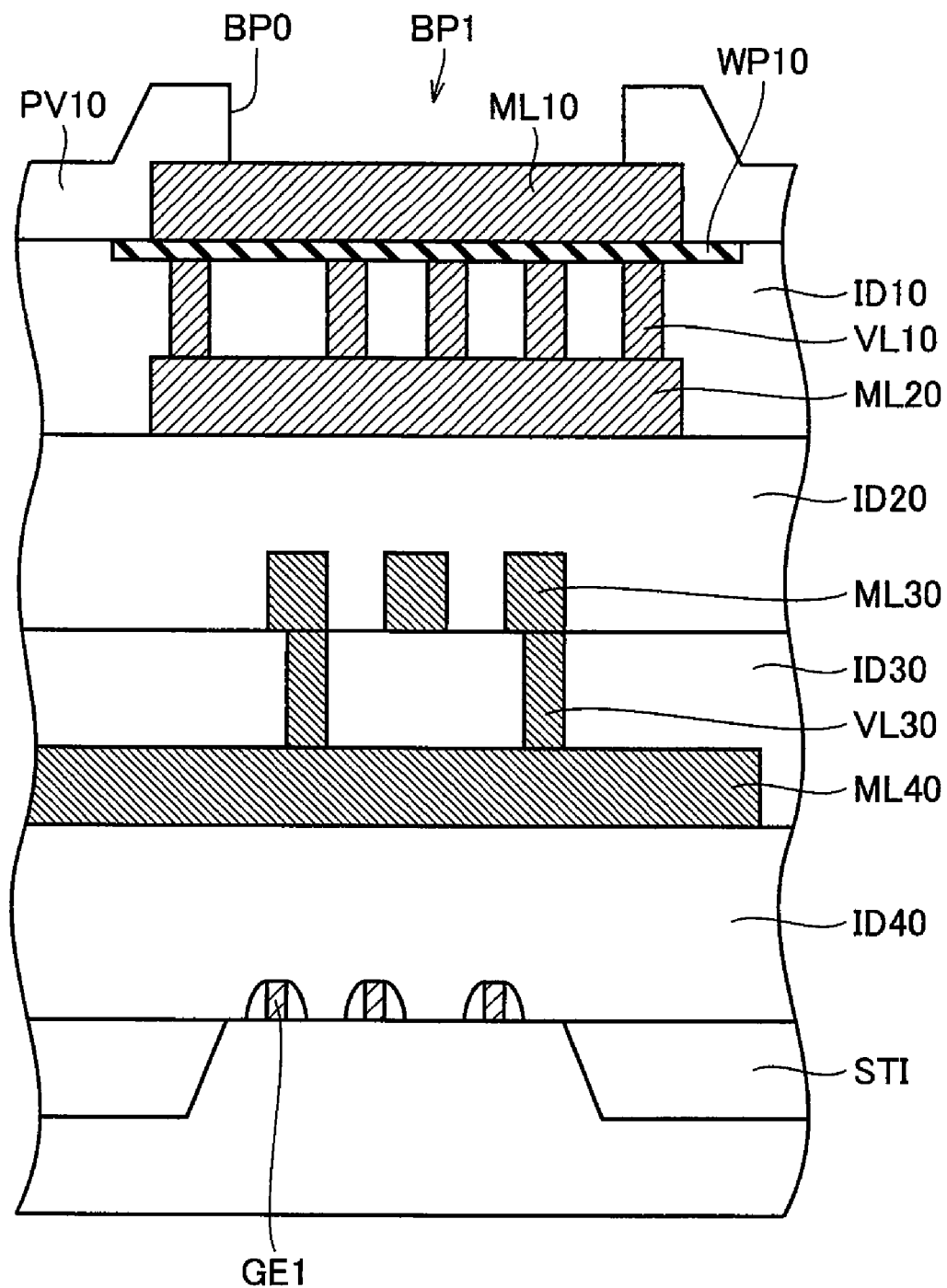
FIG. 16 is a sectional view (taken on a line A-A and seen along an arrow) showing the input and output unit in the semiconductor device according to the second embodiment of the present invention.
Figure 17:
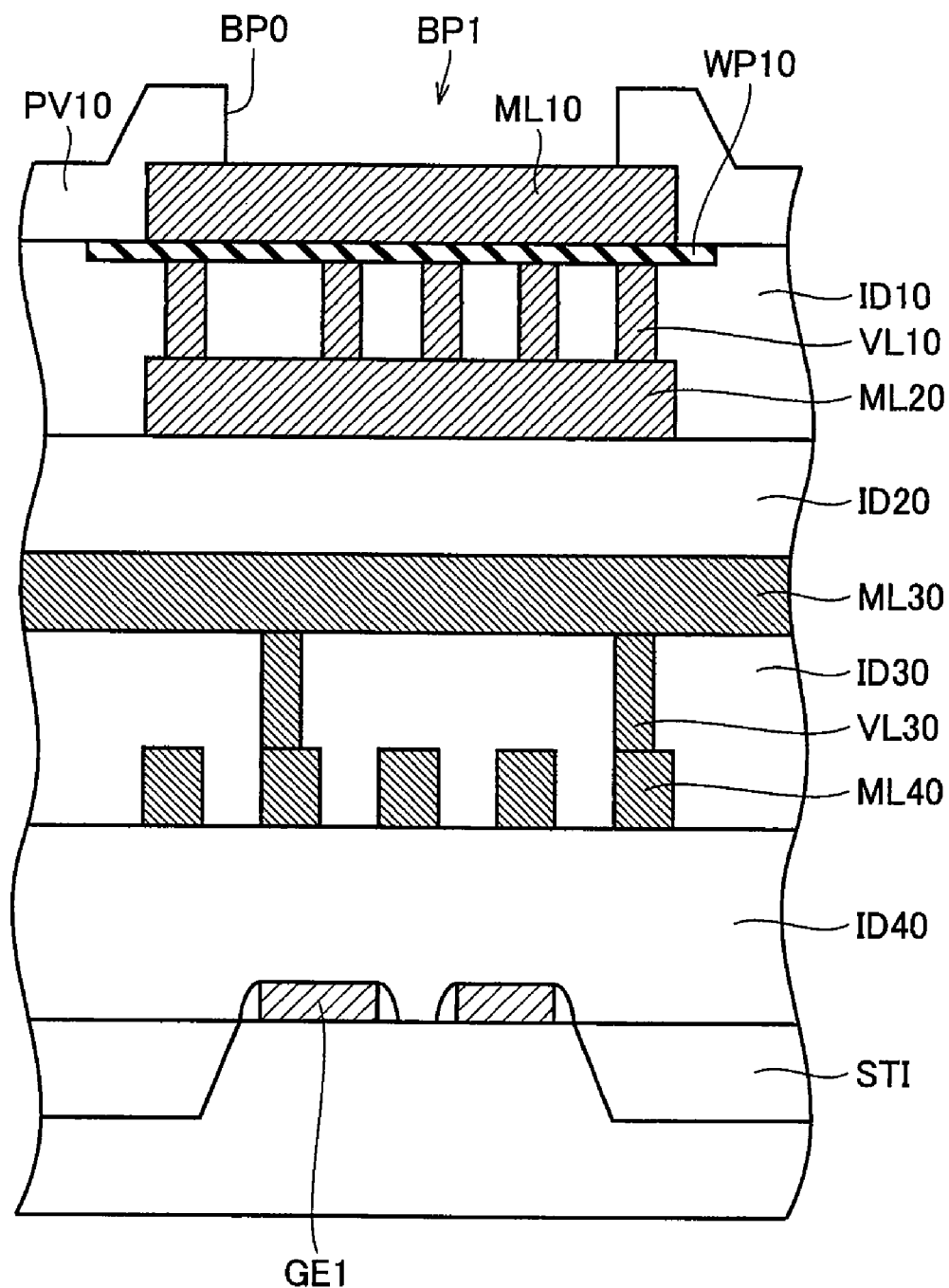
FIG. 17 is a sectional view (taken on a line B-B and seen along an arrow) showing the input and output unit in the semiconductor device according to the second embodiment of the present invention.

Referring to FIG. 15 to 17, a structure of a semiconductor device according to a second embodiment of the invention will be described. Similarly to the first embodiment, in the semiconductor device of the second embodiment, the region below the bonding pad is effectively utilized in order to achieve the high integration, and a specific layout of a structure below the bonding pad will be described. The same component as the first embodiment is designated by the same numeral, the overlapping description is neglected, and only a characteristic configuration of the semiconductor device of the second embodiment will be described in detail.

FIG. 15 is a layout chart showing an interconnection layer and a via layer of the input and output unit in a planar view, FIG. 16 is a sectional view taken on a line A-A and seen along an arrow that is shown in the layout chart of FIG. 15, and FIG. 17 is a sectional view taken on a line B-B and seen along an arrow that is shown in the layout chart of FIG. 15.

In the semiconductor device of the second embodiment, a support pad WP10 is provided between first metal interconnection layer ML10 constituting bonding pad BP1 and first via layer VL10. Support pad WP10 has an area larger than that of opening BPO provided in passivation film PV10, and support pad WP10 has hardness larger than that of first metal interconnection layer ML10. In a case where aluminum, copper, and alloys thereof (such as Al—Si—Cu and Al—Cu) are used as the material for first metal interconnection layer ML10, tungsten whose hardness is larger than those of the materials is used as the specific material for support pad WP10.

In a case where support pad WP10 is provided as described above, when the stress is applied to bonding pad BP1 from outside, the stress is received by support pad WP10 to substantially disperse the force in a whole of support pad WP10, and the force is further dispersed in first via layer VL10 and the like located below support pad WP10. As a result, the stress is wholly dispersed more effectively, and the stress concentration on the particular point can be relieved to restrain the deterioration in semiconductor device strength to a minimum.

In the second embodiment, the structure in which support pad WP10 is provided is applied to the four-layer interconnection structure of the first embodiment, that is, "configuration in which the metal interconnection layer (fourth metal interconnection layer) immediately above the semiconductor layer is orthogonal to the metal interconnection layer (third metal interconnection layer) above the metal interconnection layer (fourth metal interconnection layer)". However, the structure in which support pad WP10 is provided is not limited to the four-layer interconnection structure of the first embodiment.

Even in at least five interconnection layers in which the orthogonal structure of the first embodiment is not adopted, support pad WP10 is provided between first metal interconnection layer ML10 constituting bonding pad BP1 and first via layer VL10. Support pad WP10 has the area larger than that of opening BPO provided in passivation film PV10, and support pad WP10 has the hardness larger than that of first metal interconnection layer ML10. Therefore, the stress applied to bonding pad BP1 is dispersed to relieve the stress concentration on the particular point, and it can be expected that the deterioration in semiconductor device strength is restrained.

In the second embodiment, support pad WP10 is provided in bonding pad BP1. Additionally, when the bonding pad is provided in bonding pad BP2, the same effect can be obtained.

Third Embodiment

Figure 18:
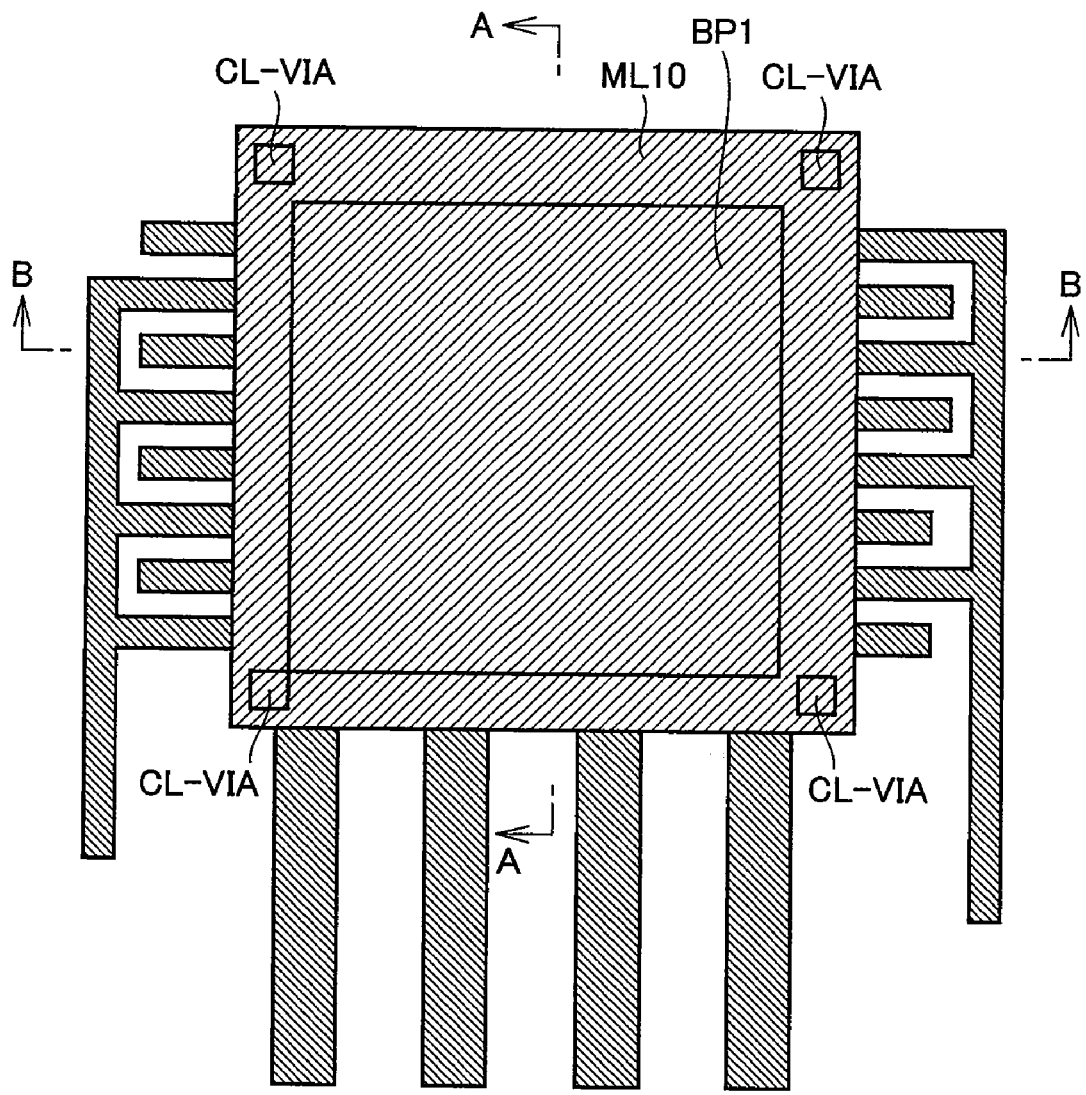
FIG. 18 is a layout chart showing an interconnection of an input and output unit in a semiconductor device according to a third embodiment of the present invention.
Figure 19:
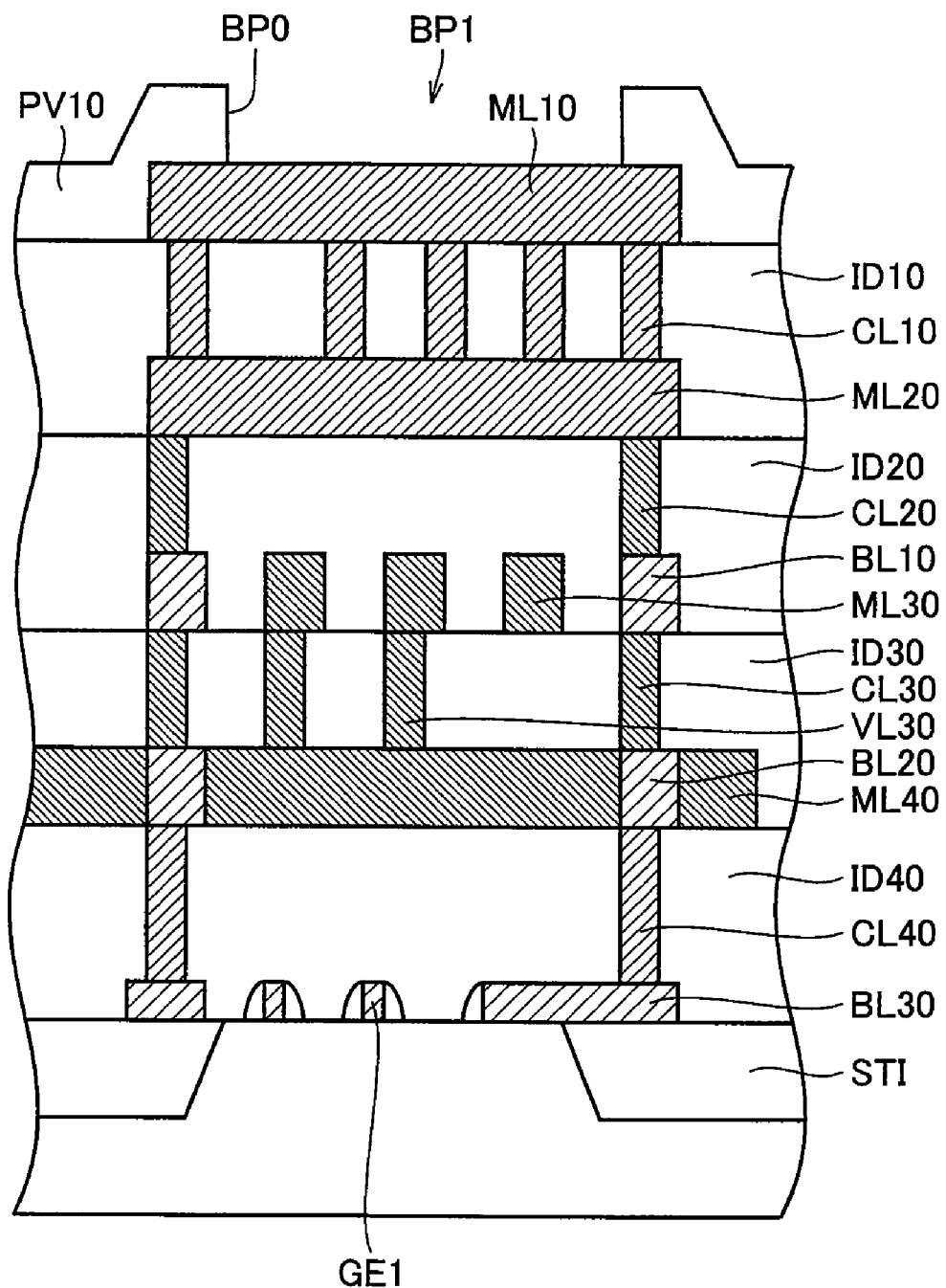
FIG. 19 is a sectional view (taken on a line A-A and seen along an arrow) showing the input and output unit in the semiconductor device according to the third embodiment of the present invention.
Figure 20:
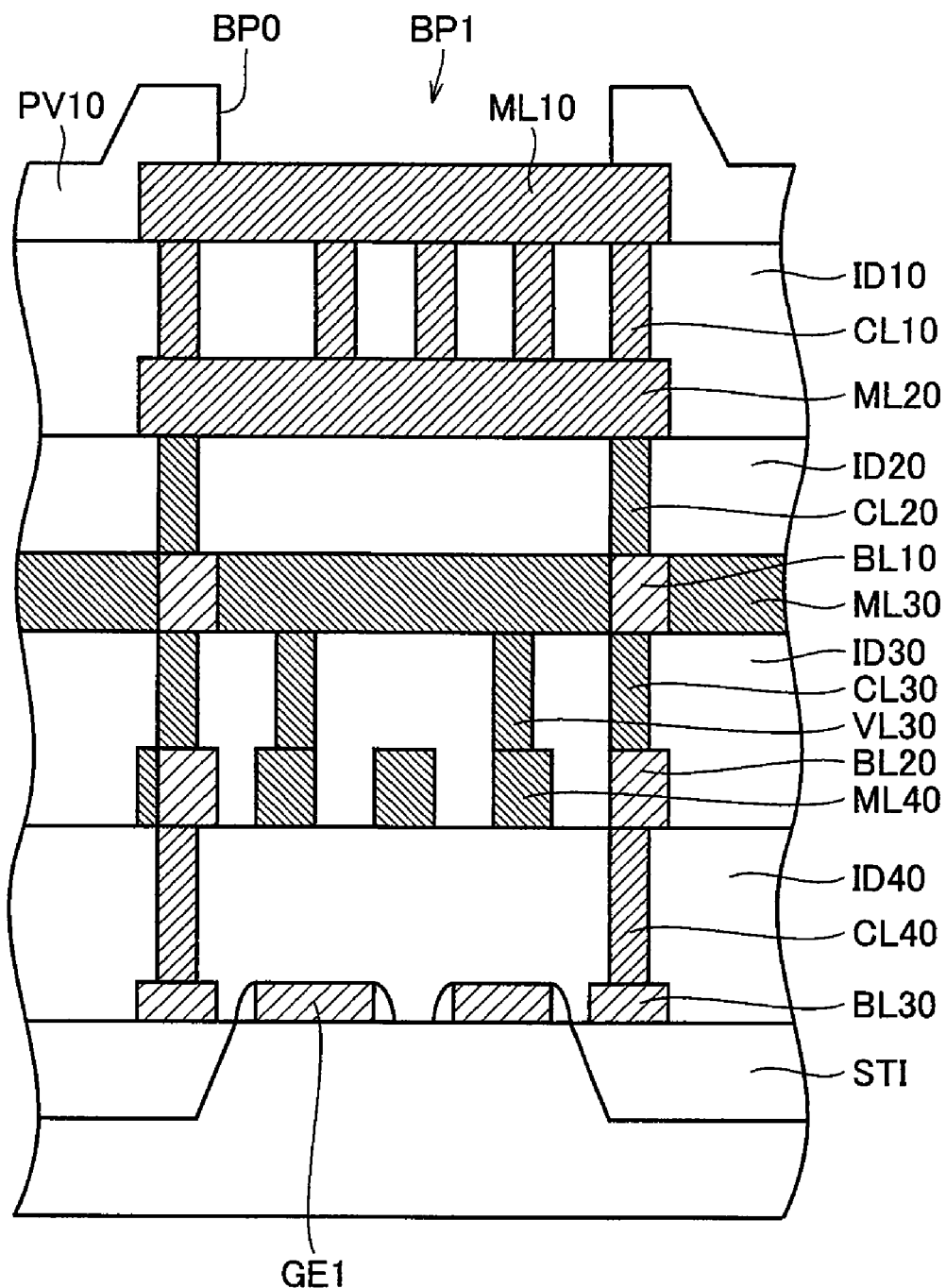
FIG. 20 is a sectional view (taken on a line B-B and seen along an arrow) showing the input and output unit in the semiconductor device according to the third embodiment of the present invention.

Referring to FIG. 18 to 20, a structure of a semiconductor device according to a third embodiment of the invention will be described. Similarly to the first embodiment, in the semiconductor device of the third embodiment, the region below the bonding pad is effectively utilized in order to achieve the high integration, and a specific layout of a structure below the bonding pad will be described. The same component as the first embodiment is designated by the same numeral, the overlapping description is neglected, and only a characteristic configuration of the semiconductor device of the third embodiment will be described in detail.

FIG. 18 is a layout chart showing an interconnection layer and a via layer of the input and output unit the input and output unit in a planar view, FIG. 19 is a sectional view taken on a line A-A and seen along an arrow that is shown in the layout chart of FIG. 18, and FIG. 20 is a sectional view taken on a line B-B and seen along an arrow that is shown in the layout chart of FIG. 18.

In the semiconductor device of the third embodiment, columnar support structures CL-VIA are provided between bonding pad BP1 and semiconductor layer SC. At the same points in the planar view, columnar support structures CL-VIA support a gap between first metal interconnection layer ML10 and second metal interconnection layer ML20, a gap between second interconnection layer ML20 and third interconnection layer ML30, a gap between third interconnection layer ML30 and fourth interconnection layer ML40, and a gap between fourth interconnection layer ML40 and gate electrode layer GE1.

With reference to specific columnar support structure CL-VIA, a columnar support CL10 is disposed between first metal interconnection layer ML10 and second metal interconnection layer ML20, and columnar support CL10 is formed in the production process same as the first via layer. A base BL10 formed in the production process same as third metal interconnection layer ML30 is provided, and a columnar support CL20 formed in the production process same as the second via layer is provided between the base BL10 and second metal interconnection layer ML20.

A base BL20 formed in the production process same as fourth metal interconnection layer ML40 is provided, and a columnar support CL30 formed in the production process same as the third via layer is provided between the base BL20 and third metal interconnection layer ML30. A base BL30 formed in the production process same as gate electrode layer GE1 is provided, and a columnar support CL40 formed in the production process same as the fourth via layer is provided between the base BL30 and fourth metal interconnection layer ML40.

In the third embodiment, as shown in the layout chart of FIG. 18, columnar support structures CL-VIA having the above-described configurations are disposed in regions near four corners of bonding pad BP1. Columnar support CL30 located on semiconductor layer SC is provided so as to be located on an isolation region STI provided on semiconductor layer SC.

In a case where columnar support structures CL-VIA are provided as described above, when the stress is applied to bonding pad BP1 from outside, the force is dispersed in the columnar support structures CL-VIA, and the force can be transferred into lower-layer semiconductor layer SC. As a result, the stress is dispersed more effectively, and the stress concentration on the particular point can be relieved to restrain the deterioration in semiconductor device strength to a minimum.

In the third embodiment, the structure in which columnar support structures CL-VIA are provided is applied to the four-layer interconnection structure of the first embodiment, that is, "configuration in which the metal interconnection layer (fourth metal interconnection layer) immediately above the semiconductor layer is orthogonal to the metal interconnection layer (third metal interconnection layer) above the metal interconnection layer (fourth metal interconnection layer)". However, the structure in which columnar support structures CL-VIA are provided is not limited to the four-layer interconnection structure of the first embodiment.

Even in at least five interconnection layers in which the orthogonal structure of the first embodiment is not adopted, columnar support structure CL-VIA is provided between bonding pad BP1 and semiconductor layer SC. Therefore, the stress applied to bonding pad BP1 is dispersed to relieve the stress concentration on the particular point, and it can be expected that the deterioration in semiconductor device strength is restrained.

In the third embodiment, columnar support structures CL-VIA are provided at for corners of bonding pad BP1. Alternatively, the columnar support structure can be provided in at least one point to transfer the force applied to bonding pad BP1 to semiconductor layer SC.

In the structure of the third embodiment, base BL10 and base BL20 are separately provided for columnar support structure CL-VIA. This is because the structure of the third embodiment is adopted based on the relationship with the metal interconnection pattern. In a case where the metal interconnection is located below columnar support structure CL-VIA (second metal interconnection ML20 in FIG. 19), the metal interconnection can directly be used as the base. In the third embodiment, columnar support structure CL-VIA is disposed on isolation region STI. However, in a case where a layout restriction exists, columnar support structure CL-VIA may be provided on isolation region STI.

Fourth Embodiment

Figure 21:
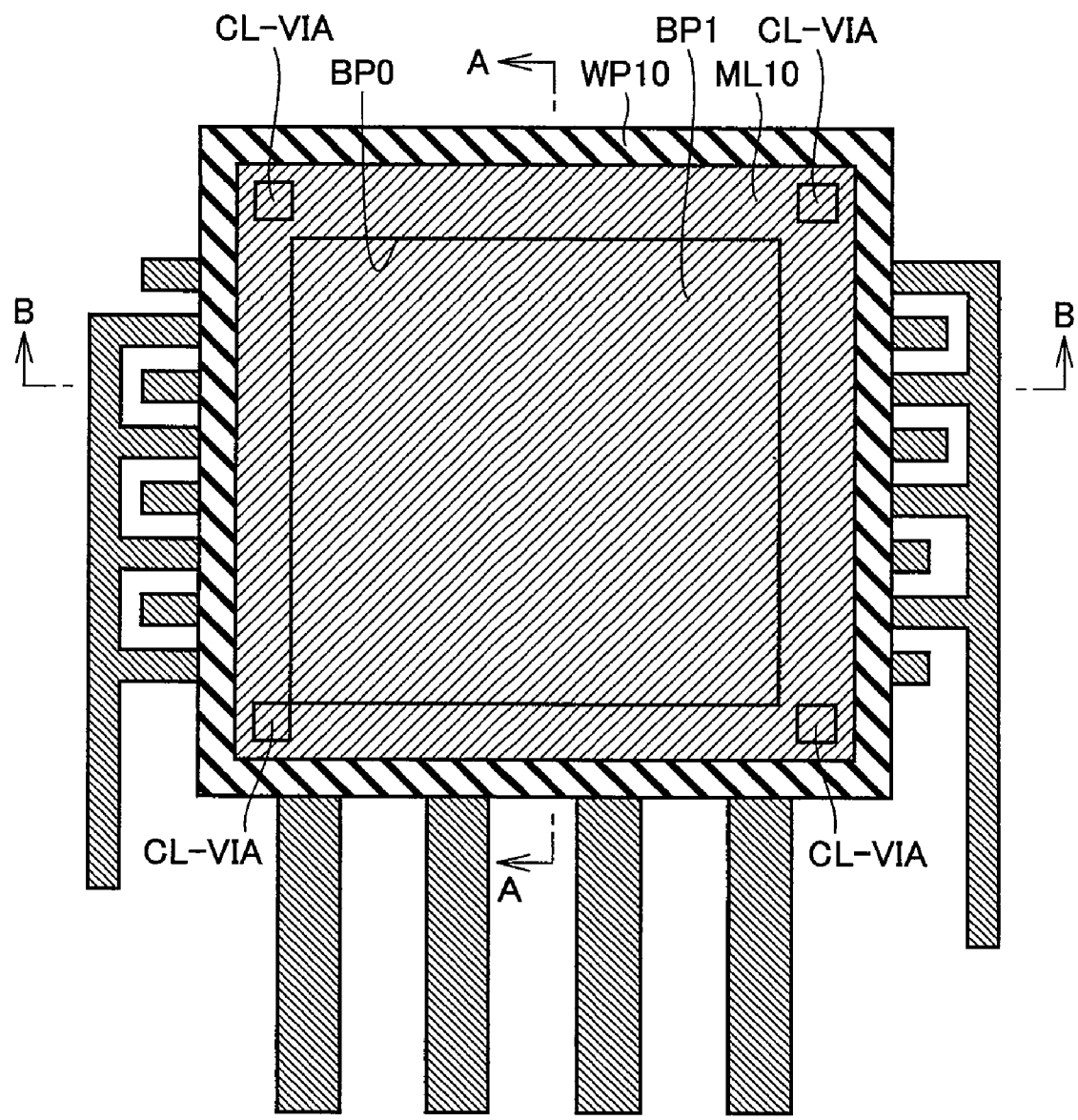
FIG. 21 is a layout chart showing an interconnection of an input and output unit in a semiconductor device according to a fourth embodiment of the present invention.
Figure 22:
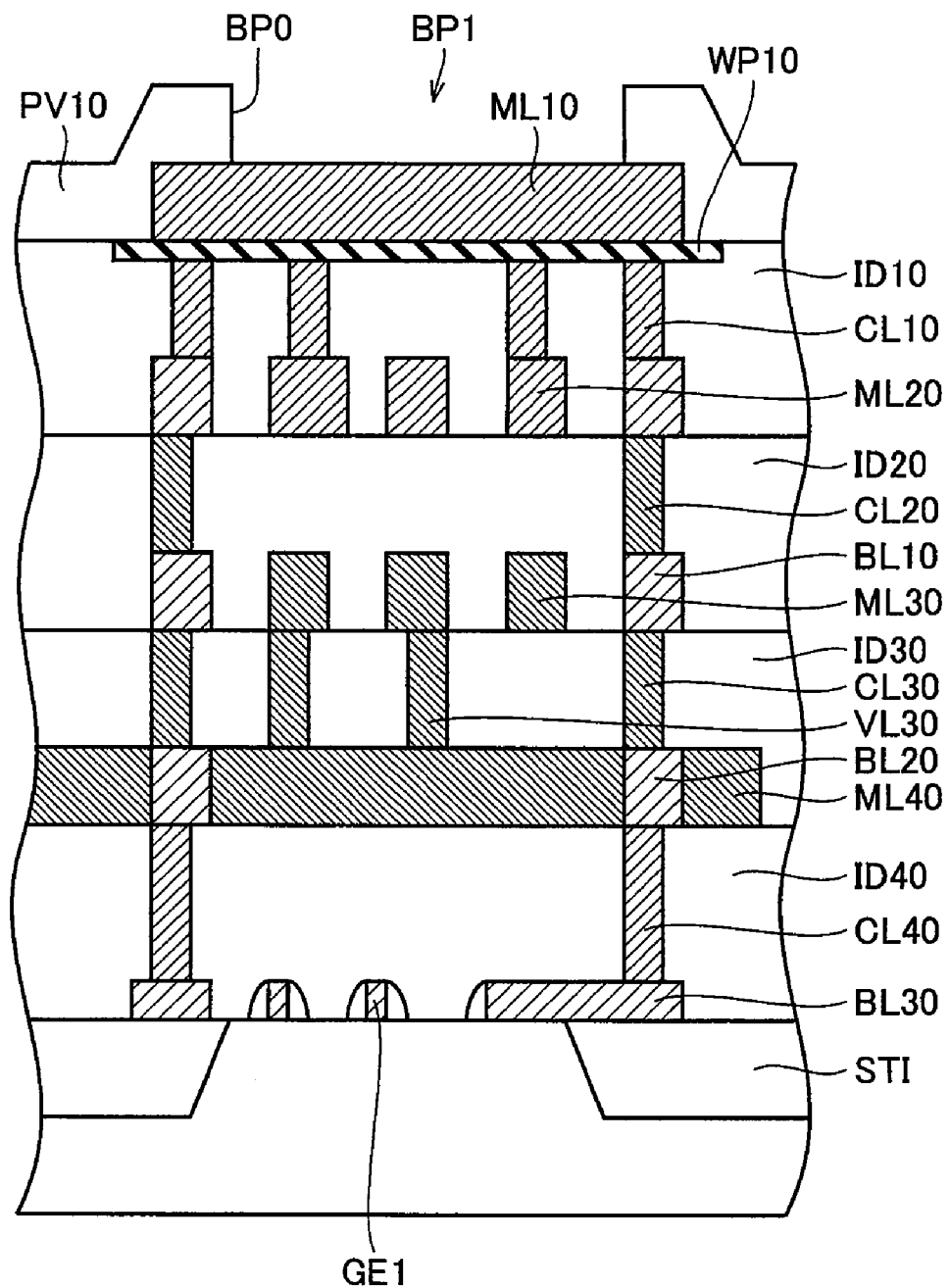
FIG. 22 is a sectional view (taken on a line A-A and seen along an arrow) showing the input and output unit in the semiconductor device according to the fourth embodiment of the present invention.
Figure 23:
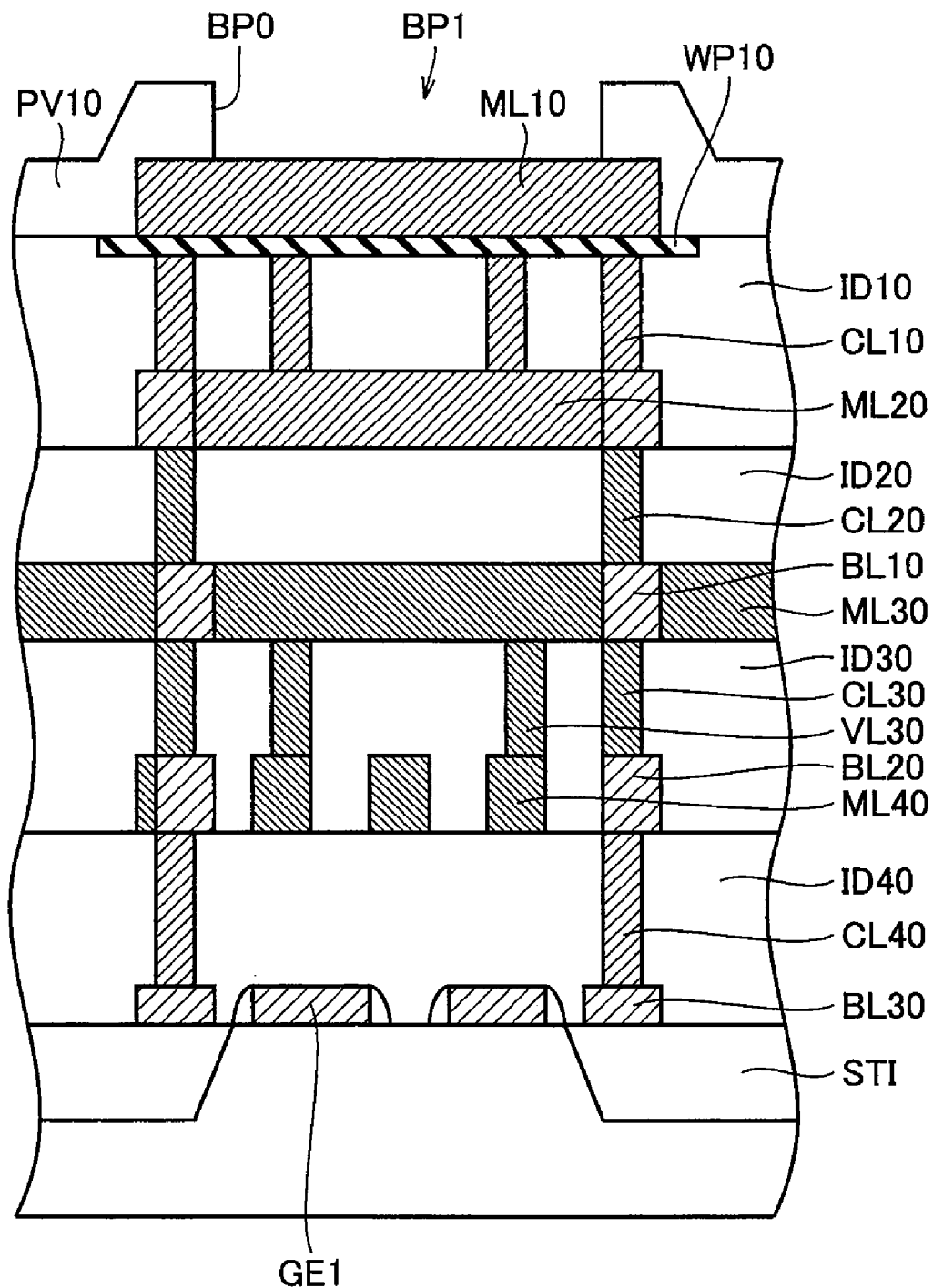
FIG. 23 is a sectional view (taken on a line B-B and seen along an arrow) showing the input and output unit in the semiconductor device according to the fourth embodiment of the present invention.

Referring to FIG. 21 to 23, a structure of a semiconductor device according to a fourth embodiment of the invention will be described. Similarly to the first embodiment, in the semiconductor device of the fourth embodiment, the region below the bonding pad is effectively utilized in order to achieve the high integration, and a specific layout of a structure below the bonding pad will be described.

More specifically, the configuration of the second embodiment in which support pad WP10 is provided and the configuration of the third embodiment in which columnar support structure CL-VIA is provided are combined in the semiconductor device of the fourth embodiment. Accordingly, the same component as those of the first to third embodiments is designated by the same numeral, the overlapping description is neglected, and only a characteristic configuration of the semiconductor device of the fourth embodiment will be described in detail.

FIG. 21 is a layout chart showing an interconnection layer and a via layer of the input and output unit the input and output unit in a planar view, FIG. 22 is a sectional view taken on a line A-A and seen along an arrow that is shown in the layout chart of FIG. 21, and FIG. 23 is a sectional view taken on a line B-B and seen along an arrow that is shown in the layout chart of FIG. 21.

In the semiconductor device of the fourth embodiment, columnar support structures CL-VIA are provided between support pad WP10 and semiconductor layer SC. When the stress is applied to bonding pad BP1 from outside, the force is received by support pad WP10, the force is dispersed from support pad WP10 to columnar support structure CL-VIA, and the force can be transferred into lower-layer semiconductor layer SC. As a result, the stress is dispersed more effectively, and the stress concentration on the particular point can be relieved to restrain the deterioration in semiconductor device strength to a minimum.

In the fourth embodiment, the structure in which columnar support structures CL-VIA are provided is applied to the four-layer interconnection structure of the first embodiment, that is, "configuration in which the metal interconnection layer (fourth metal interconnection layer) immediately above the semiconductor layer is orthogonal to the metal interconnection layer (third metal interconnection layer) above the metal interconnection layer (fourth metal interconnection layer)". However, the structure in which columnar support structures CL-VIA are provided is not limited to the four-layer interconnection structure of the first embodiment.

Even in at least five interconnection layers in which the orthogonal structure of the first embodiment is not adopted, columnar support structure CL-VIA is provided between bonding pad BP1 and semiconductor layer SC. Therefore, the stress applied to bonding pad BP1 is dispersed to relieve the stress concentration on the particular point, and it can be expected that the deterioration in semiconductor device strength is restrained.

In the fourth embodiment, columnar support structures CL-VIA are provided at for corners of bonding pad BP1. Alternatively, the columnar support structure can be provided in at least one point to transfer the force applied to support pad WP10 to semiconductor layer SC.

In the structure of the fourth embodiment, base BL10 and base BL20 are separately provided for columnar support structure CL-VIA. This is because the structure of the fourth embodiment is adopted based on the relationship with the metal interconnection pattern. In a case where the metal interconnection is located below columnar support structure CL-VIA (second metal interconnection ML20 in FIG. 19), the metal interconnection can directly be used as the base. In the fourth embodiment, columnar support structure CL-VIA is disposed on isolation region STI. However, in a case where the layout restriction exists, columnar support structure CL-VIA may be provided on isolation region STI.

The invention can widely be applied to the semiconductor device including the bonding pad, and the invention can restrain the deterioration in semiconductor device strength and the high integration of the semiconductor device.

Although the present invention has been described and illustrated in detail, it is clearly understood that the same is by way of illustration and example only and is not to be taken by way of limitation, the scope of the present invention being interpreted by the terms of the appended claims.

What is claimed is:
1. A semiconductor device comprising:
    a first interconnection layer that includes a bonding pad exposed from an opening provided in a surface protective film;

a first via layer that is provided below said first interconnection layer;
a second interconnection layer that is provided below said first via layer;
a second via layer that is provided below said second interconnection layer;
a third interconnection layer that is provided below said second via layer and disposed in a stripe shape;
a third via layer that is provided below said third interconnection layer;
a fourth interconnection layer that is provided below said third via layer and disposed in a stripe shape; and
a fourth via layer that is provided below said fourth interconnection layer, wherein
said first interconnection layer, said first via layer, said second interconnection layer, said second via layer, said third interconnection layer, said third via layer, said fourth interconnection layer, and said fourth via layer are laminated,
the bonding pad overlaps the first via layer, the second interconnection layer, the third interconnection layer, and the fourth interconnection layer in plan view,
the first via layer is formed in a stripe shape and is disposed in parallel to the third interconnection layer,
a first width of the first via layer is equal to or smaller than a second width of the third interconnection layer, and the second width of the third interconnection layer is equal to or smaller than a third width of the fourth interconnection layer,
a direction in which said third interconnection layer extends is orthogonal to a direction in which said fourth interconnection layer extends,
said first interconnection layer, said first via layer, said second interconnection layer, said second via layer, said third interconnection layer, said third via layer, said fourth interconnection layer, said fourth via layer, and a semiconductor layer are laminated on a semiconductor chip having a rectangular shape in a planar view,
said first via layer is provided in parallel to an outer peripheral edge of said semiconductor chip while being disposed in a stripe shape,
said third interconnection layer is provided in parallel to an outer periphery of said semiconductor chip,
a gate electrode layer is disposed in a stripe shape in said semiconductor layer, and
a direction in which said gate electrode layer extends is parallel to said direction in which said fourth interconnection layer extends.

2. The semiconductor device according to claim 1, wherein columnar support structures are provided between a portion below said bonding pad and a portion above said gate electrode layer, said columnar support structures supporting a gap between said first interconnection layer and said second interconnection layer, a gap between said second interconnection layer and said third interconnection layer, a gap between said third interconnection layer and said fourth interconnection layer, and a gap between said fourth interconnection layer and said gate electrode layer at identical points in a planar view.

3. The semiconductor device according to claim 1, wherein a circular power supply potential interconnection disposed along the outer peripheral edge and a circular reference potential interconnection disposed inside the power supply potential interconnection are provided in said semiconductor chip,
a circuit in which said third interconnection layer is used as said power supply potential interconnection and a circuit in which said third interconnection layer is used as said reference potential interconnection are defined, and
bonding pads are arranged in a zigzag manner in a planar view above a direction in which said power supply potential interconnection and said reference potential interconnection are laminated.

4. The semiconductor device according to claim 1, wherein a support pad is provided between said first interconnection layer constituting said bonding pad and said first via layer, said support pad having an area larger than an area of said opening provided in said surface protective film and having hardness larger than hardness of said first interconnection layer.

5. The semiconductor device according to claim 4, wherein columnar support structures are disposed in regions near four corners of said bonding pad.

6. The semiconductor device according to claim 4, wherein an element isolation region provided in said semiconductor layer is located in a lower surface of a gate electrode layer supporting columnar support structures.

* * * * *